(12) United States Patent
Kwon et al.

(10) Patent No.: US 12,288,745 B2
(45) Date of Patent: Apr. 29, 2025

(54) SEMICONDUCTOR PACKAGE

(71) Applicant: SAMSUNG ELECTRONICS CO., LTD., Suwon-si (KR)

(72) Inventors: Donguk Kwon, Asan-si (KR); Wooram Myung, Suwon-si (KR); Jiwon Shin, Daejeon (KR); Pilsung Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 500 days.

(21) Appl. No.: 17/844,815

(22) Filed: Jun. 21, 2022

(65) Prior Publication Data

US 2023/0099351 A1   Mar. 30, 2023

(30) Foreign Application Priority Data

Sep. 27, 2021  (KR) .................. 10-2021-0127087

(51) Int. Cl.
*H01L 23/498* (2006.01)
*H01L 23/00* (2006.01)
(Continued)

(52) U.S. Cl.
CPC ...... *H01L 23/49838* (2013.01); *H01L 23/481* (2013.01); *H01L 23/49822* (2013.01); *H01L 24/32* (2013.01); *H01L 25/105* (2013.01); *H01L 23/49816* (2013.01); *H01L 24/16* (2013.01); *H01L 24/73* (2013.01);
(Continued)

(58) Field of Classification Search
CPC ... H01L 23/49822; H01L 23/16; H01L 23/50; H01L 23/5385; H01L 23/5386; H01L 23/5389; H01L 24/32; H01L 24/18; H01L 24/49; H01L 24/92; H01L 25/0657; H01L 25/16; H01L 2224/16227; H01L 2224/26175; H01L 2224/32225; H01L 2224/73204; H01L 2224/0401;
(Continued)

(56) References Cited

U.S. PATENT DOCUMENTS 8,409,923 B2   4/2013  Kim et al.
9,177,886 B2   11/2015  Ko et al.
(Continued)

*Primary Examiner* — Jasmine J Clark
(74) *Attorney, Agent, or Firm* — Morgan, Lewis & Bockius LLP

(57) ABSTRACT

A semiconductor package includes a lower substrate having a chip mounting region, an interconnection region surrounding the chip mounting region, and an outer region surrounding the interconnection region, and includes a lower wiring layer. A first solder resist pattern has first openings exposing bonding regions of the lower wiring layer. A semiconductor chip is on the chip mounting region and is electrically connected to the lower wiring layer. A second solder resist pattern is on the first solder resist pattern on the interconnection and outer regions and is spaced apart from the semiconductor chip, and includes second openings disposed on the first openings. An upper substrate covers the semiconductor chip, and includes an upper wiring layer. A vertical connection structure is on the interconnection region and electrically connects the upper and lower wiring layers. A solder resist spacer is on the second solder resist pattern on the outer region.

20 Claims, 14 Drawing Sheets

(51) Int. Cl.
  *H01L 23/48* (2006.01)
  *H01L 25/10* (2006.01)
(52) U.S. Cl.
  CPC .............. *H01L 2224/16227* (2013.01); *H01L 2224/16237* (2013.01); *H01L 2224/26175* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01)
(58) Field of Classification Search
  CPC . H01L 2224/04042; H01L 2224/73265; H01L 2224/13111; H01L 2224/13147
  USPC ......................................................... 257/784
  See application file for complete search history.

(56) References Cited

U.S. PATENT DOCUMENTS

| | | | |
|---|---|---|---|
| 10,256,177 B2 | 4/2019 | Shen et al. | |
| 10,388,582 B2 | 8/2019 | Kim et al. | |
| 10,825,774 B2 * | 11/2020 | Oh | H01L 23/5389 |
| 2012/0013007 A1 | 1/2012 | Hwang et al. | |
| 2012/0068353 A1 | 3/2012 | Huang et al. | |
| 2014/0015129 A1 | 1/2014 | Kim et al. | |
| 2017/0098634 A1 | 4/2017 | Kumar et al. | |
| 2020/0027803 A1 | 1/2020 | Lu et al. | |

\* cited by examiner

SEMICONDUCTOR PACKAGE

CROSS TO REFERENCE TO RELATED APPLICATION(S)

This application claims priority under 35 U.S.C. § 119 to Korean Patent Application No. 10-2021-0127087, filed on Sep. 27, 2021 in the Korean Intellectual Property Office, the disclosure of which is incorporated by reference in its entirety herein.

1. TECHNICAL FIELD

Embodiments of the present disclosure relate to a semiconductor package.

2. DISCUSSION OF RELATED ART

In accordance with recent trends in the field of semiconductor packaging for high performance and miniaturization of electronic devices, a package-on-package (POP) technique has been developed. In the package-on-package technique, two or more semiconductor packages may be vertically stacked. However, in the package-on-package technique there has been occurrences of adhesion failure between upper and lower packages. Therefore, devices for addressing adhesion failure between upper and lower packages are being developed.

SUMMARY

An embodiment of the present disclosure is to provide a semiconductor package having increased electrical performance with respect to a package-on-package (POP) structure.

According to an embodiment of the present disclosure, a semiconductor package includes a lower substrate having first and second surfaces opposing each other. The first surface has a chip mounting region, an interconnection region surrounding the chip mounting region, and an outer region surrounding the interconnection region. The lower substrate further includes a lower wiring layer having bonding regions. A first solder resist pattern is disposed on the first surface of the lower substrate and has first openings exposing the bonding regions of the lower wiring layer. A semiconductor chip is disposed on the chip mounting region and is electrically connected to the lower wiring layer through at least a portion of the first openings. A second solder resist pattern is on the first solder resist pattern on the interconnection region and the outer region of the lower substrate and is spaced apart from the semiconductor chip. The second solder resist pattern has second openings disposed on at least a portion of the first openings. An upper substrate is disposed to cover the semiconductor chip on the first surface of the lower substrate. The upper substrate includes an upper wiring layer. A vertical connection structure is disposed on the interconnection region and electrically connects the lower wiring layer to the upper wiring layer through at least a portion of the first openings and the second openings. A solder resist spacer is disposed on the second solder resist pattern on the outer region.

According to an embodiment of the present disclosure, a semiconductor package includes a lower substrate including a lower wiring layer and first to third solder resist patterns sequentially stacked on the lower wiring layer. The lower substrate has a chip mounting region, an interconnection region surrounding the chip mounting region and an outer region surrounding the interconnection region. A semiconductor chip is disposed on the chip mounting region and is electrically connected to the lower wiring layer. An upper substrate is disposed on the semiconductor chip. The upper substrate includes an upper wiring layer. A vertical connection structure is disposed on the interconnection region and electrically connects the lower wiring layer to the upper wiring layer. The third solder resist pattern is disposed on the outer region and directly contacts at least a portion of the upper substrate.

According to an embodiment of the present disclosure, a semiconductor package includes a lower substrate including a lower wiring layer, and first to third solder resist patterns sequentially stacked on the lower wiring layer. A semiconductor chip is disposed on the lower substrate and is electrically connected to the lower wiring layer. An upper substrate is disposed on the semiconductor chip. The upper substrate has a lower surface adjacent to the semiconductor chip. The upper substrate includes an upper wiring layer. A vertical connection structure is disposed between the lower substrate and the upper substrate and electrically connects the lower wiring layer to the upper wiring layer. An encapsulant fills spaces between the lower substrate and the upper substrate and covers at least a portion of each of the semiconductor chip and the vertical connection structure. The connection structure has a hole shape including an outwardly curved side surface. The connection structure has a maximum width on a first level. An upper surface of the third solder resist pattern is disposed on a second level that is higher than the first level.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION OF EMBODIMENTS

Hereinafter, embodiments of the present disclosure will be described as follows with reference to the accompanying drawings.

Figure 1A:
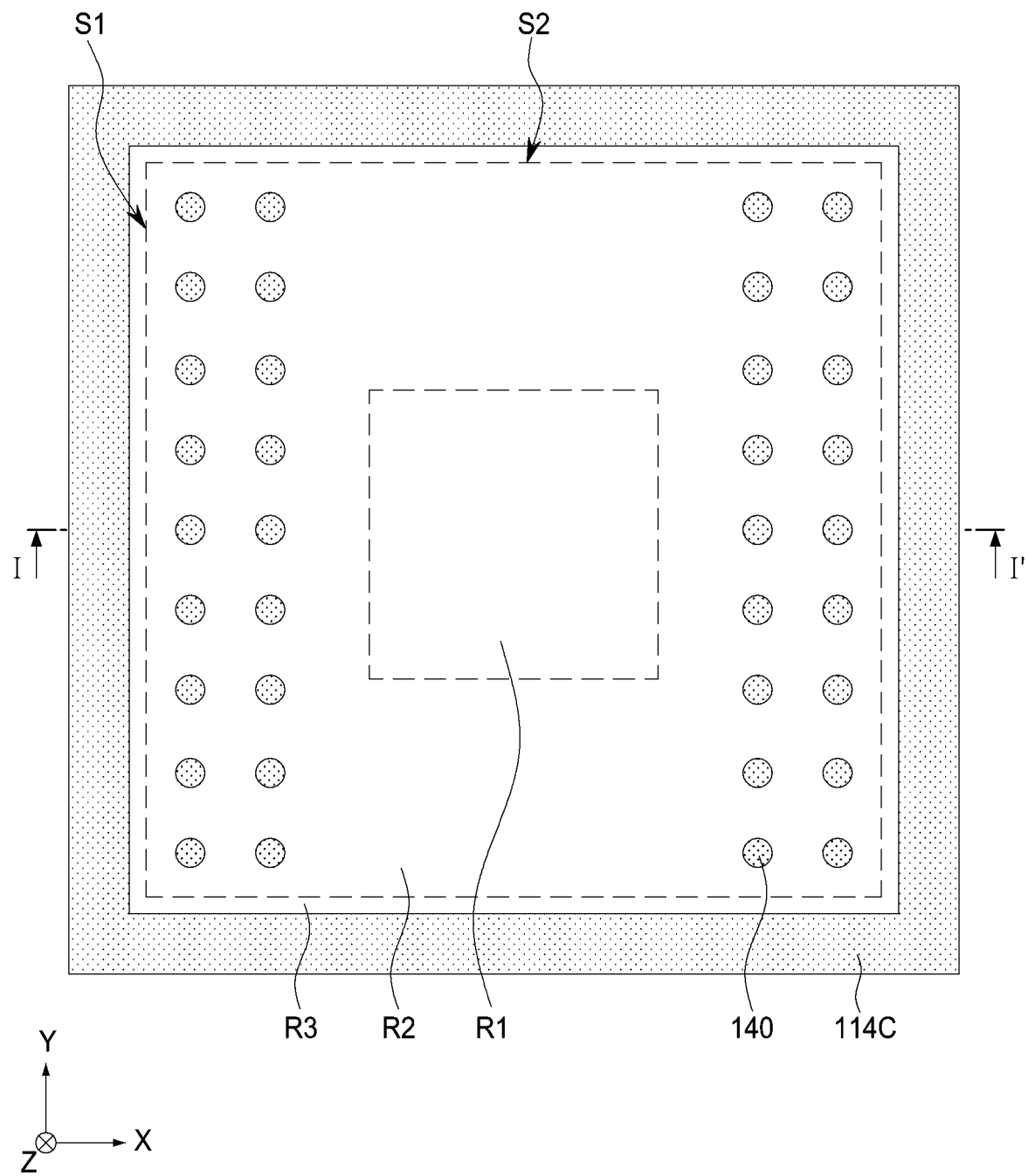
FIG. 1A is a plan view illustrating a semiconductor package according to an embodiment of the present disclosure.
Figure 1B:
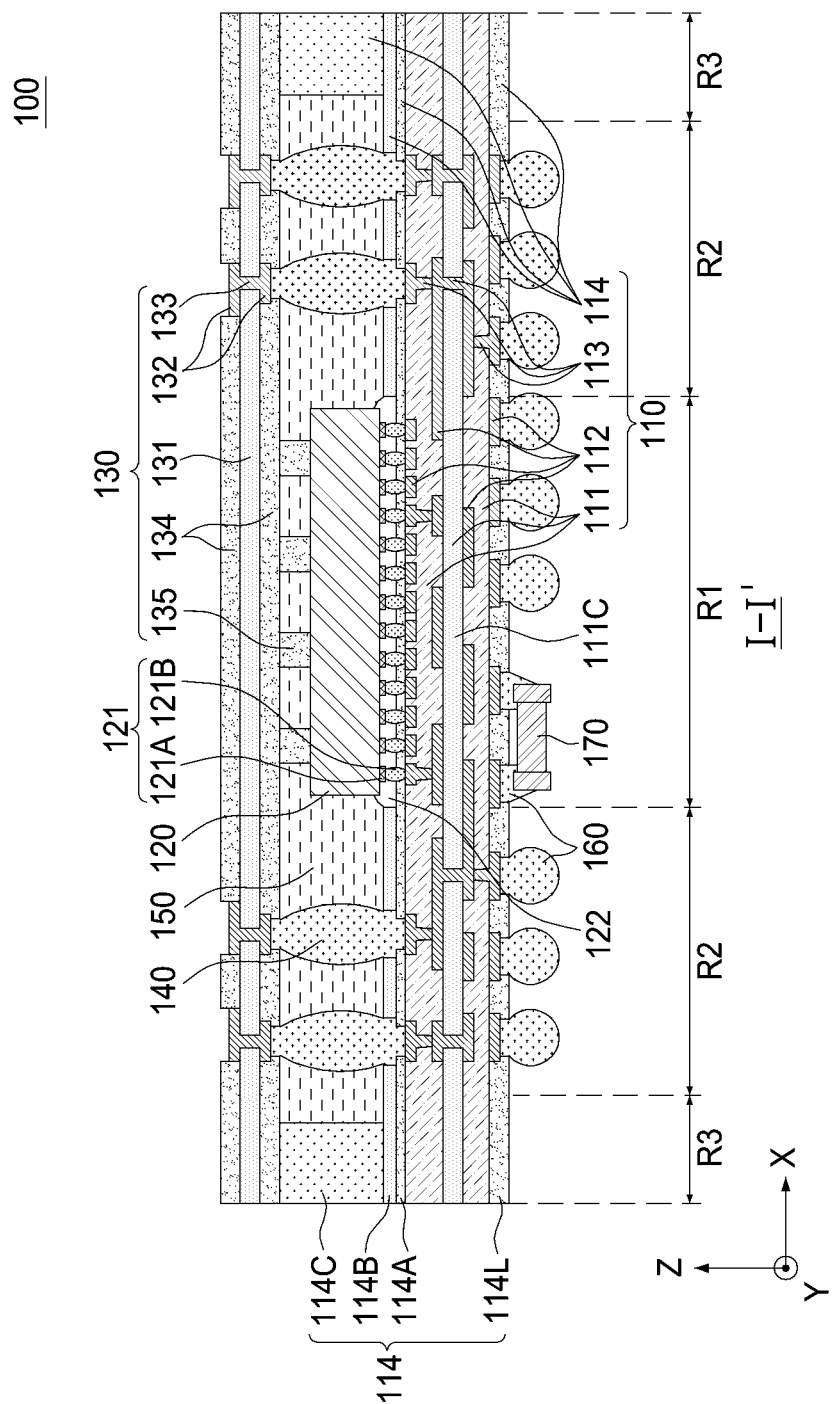
FIG. 1B is a cross-sectional view taken along line I-I' of FIG. 1A illustrating a semiconductor package according to an embodiment of the present disclosure.

FIGS. 1A and 1B are a plan diagram and a cross-sectional diagram, respectively, illustrating a semiconductor package 100 according to an embodiment. FIG. 1B is a cross-sectional diagram taken along line I-I' in FIG. 1A. FIG. 1A is a plan diagram illustrating a dispositional relationship among a chip mounting region R1, an interconnection region R2, and an outer region R3 without including some components such as an upper substrate 130.

Referring to FIGS. 1A and 1B, the semiconductor package 100 according to embodiments may include a lower substrate 110, a semiconductor chip 120, an upper substrate 130, and a vertical connection structure 140. In an embodiment, the semiconductor package 100 may further include an encapsulant 150, a connection bump 160, and/or a passive device 170.

The lower substrate 110 may have first and second surfaces opposing each other (e.g., in the Z-axis direction). The first surface of the lower substrate 110 may include a chip mounting region R1, an interconnection region R2 surrounding the chip mounting region R1, and an outer region R3 surrounding the interconnection region R2. The chip mounting region R1 may include a region on which the semiconductor chip 120 is mounted. The interconnection region R2 may include a region on which the vertical connection structure 140 for electrically connecting to the upper substrate 130 is mounted. For example, the vertical connection structure 140 may electrically connect a lower wiring layer 112 of the lower substrate 110 to an upper wiring layer 132 of the upper substrate 130. The outer region R3 may be a dummy region surrounding a region on which the vertical connection structure 140 is mounted. The outer region R3 may be a margin region necessary for a sawing process. In an embodiment, the lower substrate 110 has a square shape in a plan view (e.g., in a plane defined in the X-axis and Y-axis directions). However, embodiments of the present disclosure are not necessarily limited thereto and the lower substrate 110 may have various shapes such as a rectangular shape, etc.

The lower substrate 110 may be a support substrate on which the semiconductor chip 120 is mounted, and may be a package substrate including a lower wiring layer 112 for redistributing the semiconductor chip 120. In an embodiment, the package substrate may include a printed circuit board (PCB), a ceramic substrate, a glass substrate, a tape wiring board, and the like.

In an embodiment, the lower substrate 110 may include at least one lower insulating layer 111, at least one lower wiring layer 112, and at least one lower wiring via 113.

The lower insulating layer 111 may include an insulating resin. In an embodiment, the insulating resin may include a thermosetting resin such as an epoxy resin, a thermoplastic resin such as polyimide, or a resin in which an inorganic filler and/or a glass fiber (or a glass cloth or a glass fabric) is impregnated in the thermosetting resin or the thermoplastic resin, such as prepreg, ABF, FR-4, BT, or a photosensitive resin such as a photoimageable dielectric (PID).

In an embodiment, the lower insulating layer 111 may be a plurality of insulating layers stacked in a vertical direction (Z-axis direction). A boundary between the plurality of insulating layers 111 may not be distinct depending on the type of the processes and the order of the processes. Only three insulating layers 111 are provided in the drawings for ease of description. However, embodiments of the present disclosure are not necessarily limited thereto and the number of the insulating layers 111 may be greater than or less than three. In an embodiment, the plurality of insulating layers 111 may include a core insulating layer 111C disposed in the middle of the plurality of insulating layers 111 (e.g., in the Z-axis direction). In an embodiment, the core insulating layer 111C may have a thickness greater than those of the other insulating layers 111. The core insulating layer 111C may increase rigidity of the substrate such that warpage of the substrate may be prevented. In an embodiment, the core insulating layer 111C may be formed using, for example, a copper clad laminate (CCL), an unclad copper clad laminate (unclad CCL), a glass substrate or a ceramic substrate.

In an embodiment, the lower wiring layer 112 may include a metal material including, for example, copper (Cu), aluminum (Al), silver (Ag), tin (Sn), gold (Au), nickel (Ni), lead (Pb), titanium (Ti), or alloys thereof. The lower wiring layer 112 may include, for example, a ground pattern, a power pattern, and a signal pattern. The signal pattern may provide a path through which various signals other than the ground pattern and the power pattern, such as, for example, a data signal, are transmitted/received.

In an embodiment, the lower wiring layer 112 may be a plurality of lower wiring layers 112, respectively disposed below the plurality of lower insulating layers 111 (e.g., in the Z-axis direction). The plurality of lower wiring layers 112 may be electrically connected to each other through the lower wiring via 113. The plurality of lower wiring layers 112 may include a bonding region on which each of the semiconductor chip 120, the vertical connection structure 140, the connection bump 160, and the passive device 170 is mounted. In an embodiment, the uppermost lower wiring layer (e.g., in the Z-axis direction) and the lowermost lower wiring layer (e.g., in the Z-axis direction) may correspond to the bonding region. The bonding region may be formed to have a different pitch, depending on a mounted object. For example, a pitch of the bonding regions of the lowermost lower wiring layer on which the connection bump 160 is mounted may be greater than a pitch of the bonding region of the uppermost lower wiring layer on which the semiconductor chip 120 is mounted. In an embodiment, the thicknesses (e.g., length in the Z-axis direction) of each of the plurality of lower wiring layers 112 may be substantially the same as (e.g., equal to) each other. However, embodiments of the present disclosure are not necessarily limited thereto. For example, in an embodiment the thickness of the lowermost lower wiring layer may be greater than the thickness of the other lower wiring layers. The number of layers of the lower wiring layer 112 may be determined according to the number of layers of the lower insulating layer 111, and may be greater or smaller than the example illustrated in FIG. 1B.

The lower wiring via 113 may be electrically connected to the lower wiring layer 112 and may include a signal via, a ground via, and a power via. In an embodiment, the lower wiring via 113 may include a metal material including copper (Cu), aluminum (Al), silver (Ag), tin (Sn), gold (Au), nickel (Ni), lead (Pb), or titanium (Ti), or alloys thereof. In an embodiment, the lower wiring via 113 may include the same material as that of the lower wiring layer 112. However, embodiments of the present disclosure are not necessarily limited thereto. The lower wiring via 113 may be configured as a filled via filled with a metal material or a conformal via in which a metal material is formed along an internal wall of the via hole. In an embodiment, the lower wiring via 113 may be integrated with the lower wiring layer 112. However, embodiments of the present disclosure are not necessarily limited thereto and boundaries between the lower wiring via 113 and the lower wiring layer 112 may be distinct.

The lower substrate 110 may further include solder resist layers 114 covering at least a portion of the uppermost and lowermost lower wiring layers 112 and protecting the wiring layers from external physical/chemical damage. However, in an embodiment, the solder resist layers 114 may be components that are separate from the lower substrate 110. In an embodiment, the solder resist layers 114 may include an insulating material and may be formed using, for example, prepreg, ABF, FR-4, BT, or photo solder resist (PSR). The solder resist layers 114 may have openings exposing at least a portion of the lower wiring layer 112. At least a portion of the exposed lower wiring layer 112 may be the bonding region.

The solder resist layers 114 may include a lower solder resist pattern 114L covering the lowermost lower wiring layer among the lower wiring layers 112, a first upper solder resist pattern 114A covering an uppermost lower wiring layer among the lower wiring layers 112, and a second upper solder resist pattern 114B and a third upper solder resist pattern 114C stacked sequentially on the first upper solder resist pattern 114A (e.g., in the Z-axis direction). However, in embodiments of the present disclosure, the first upper solder resist pattern 114A may be referred to as a first solder resist pattern, the second upper solder resist pattern 114B may be referred to as a second solder resist pattern, and the third upper solder resist pattern 114C may be referred to as a solder resist spacer.

In an embodiment, the first upper solder resist pattern 114A may cover an entire upper surface of the uppermost insulating layer among the plurality of insulating layers 111 and may cover at least a portion of the upper surface of the uppermost lower wiring layer. The first upper solder resist pattern 114A may include first openings exposing bonding regions of the uppermost lower wiring layer. Accordingly, the first upper solder resist pattern 114A may expose a portion of the upper surface of the uppermost lower wiring layer electrically connected to the vertical connection structure 140 or the semiconductor chip 120. The semiconductor chip 120 and the vertical connection structure 140 may cover the first openings, respectively. For example, the vertical connection structure 140 may be in direct contact with the lateral side surface of the first upper solder resist pattern 114A. In an embodiment, the thickness of the first upper solder resist pattern 114A may be in the range of about 5 μm to about 15 μm. However, embodiments of the present disclosure are not necessarily limited thereto. The first upper solder resist pattern 114A may protect the lower substrate 110 from external physical/chemical damages.

Figure 10A:
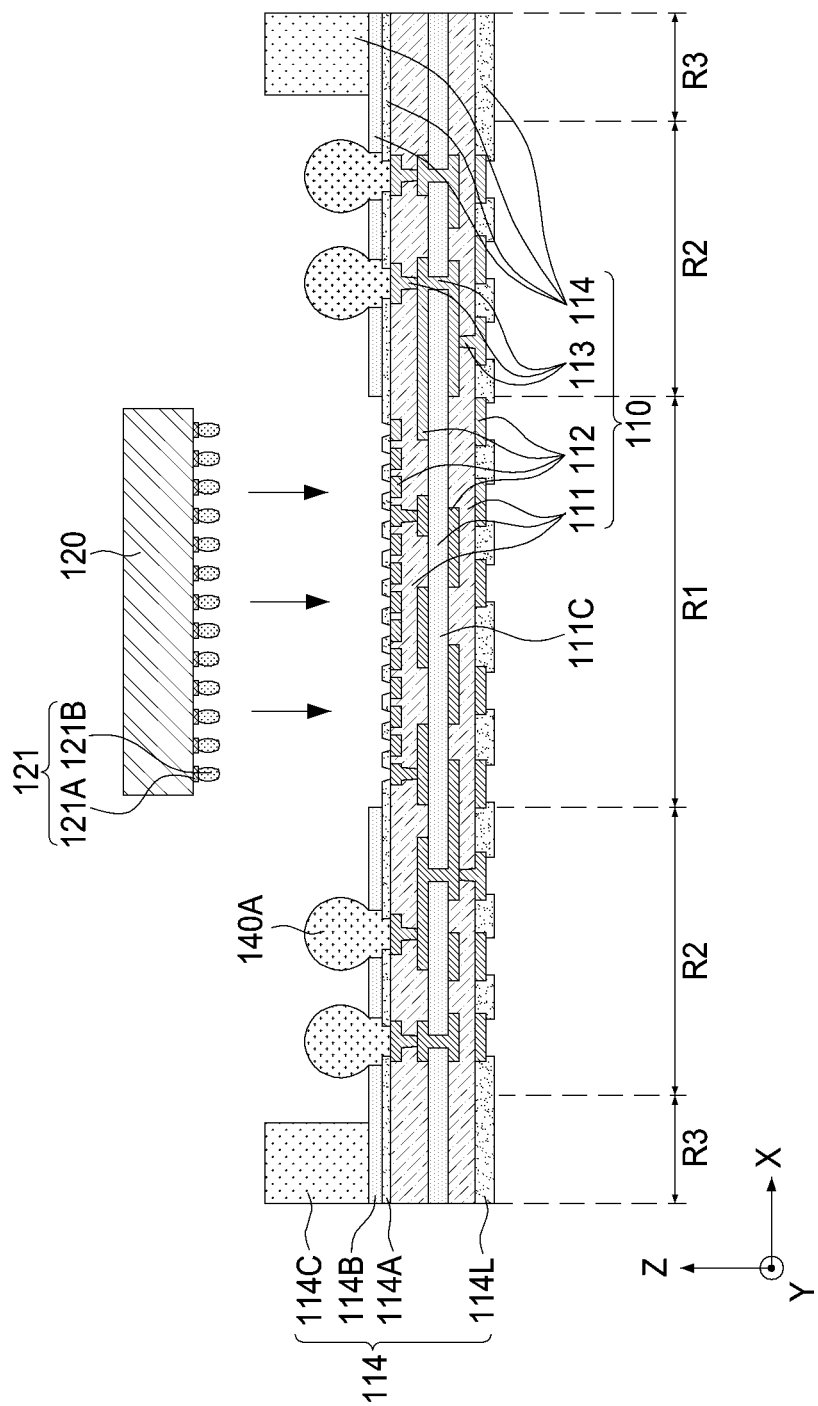
FIGS. 10A to 10C are diagrams illustrating sequential processes of a method of manufacturing a semiconductor device according to embodiments of the present disclosure.

The second upper solder resist pattern 114B may be disposed on the first upper solder resist pattern 114A (e.g., directly thereon in the Z-axis direction). The second upper solder resist pattern 114B may be disposed in the interconnection region R2 and the outer region R3 and may not be disposed in the chip mounting region R1. In the interconnection region R2, the second upper solder resist pattern 114B may be disposed on the first upper solder resist pattern 114A and may include second openings that expose a portion of the upper surface of the uppermost lower wiring layer. For example, the second openings may be disposed on at least a portion of the first openings of the first upper solder resist pattern 114A and may overlap the first openings (e.g., in the Z-axis direction). In an embodiment, the width of each of the first openings of the first upper solder resist pattern 114A may be different from the width of each of the second openings of the second upper solder resist pattern 114B in one direction parallel to the lower surface of the lower substrate 110, such as, for example, in the X-axis direction. Accordingly, a step difference may be formed between the openings. The first upper solder resist pattern 114A and the second upper solder resist pattern 114B may include the same material. However, embodiments of the present disclosure are not necessarily limited thereto and the first upper solder resist pattern 114A and the second upper solder resist pattern 114B may include different materials in some embodiments. However, even in an embodiment in which the first upper solder resist pattern 114A and the second upper solder resist pattern 114B include the same material, the first upper solder resist pattern 114A and the second upper solder resist pattern 114B may be formed by different processes such that the boundary therebetween may be distinct, and may be distinct by the step difference. In an embodiment, in the outer region R3, the second upper solder resist pattern 114B may be continuously disposed on the first upper solder resist pattern 114A and may not include an opening, such as a second opening. The second upper solder resist pattern 114B may not be disposed in the chip mounting region R1. The second upper solder resist pattern 114B may be a structure for preventing the underfill resin 122 from flowing during the process of forming the semiconductor chip 120 on the lower substrate 110. The second upper solder resist pattern 114B may separate the underfill resin 122 from the vertical connection structure 140 and the lower wiring layers 112. However, embodiments of the present disclosure are not necessarily limited thereto and the configuration of the second upper solder resist pattern 114B may vary. The upper surface of the second upper solder resist pattern 114B may be disposed on a level lower than a level on which the vertical connection structure 140 has a maximum width (e.g., maximum length in one direction parallel to the lower surface of the lower substrate 110, such as, for example, in the X-axis direction). For example, the upper surface of the second upper solder resist pattern may be disposed on a second level (e.g., distance from the lower substrate 110 in the Z-axis direction) that is lower than the first level on which the vertical connection structure 140 has a maximum width. Referring to FIG. 10A, the upper surface of the second upper solder resist pattern 114B may be disposed on a level lower than an upper surface of the lower connection structure 140A and may expose an upper end of the lower connection structure 140A. In an embodiment, the thickness of the second upper solder resist pattern 114B may be in the range of about 5 μm to about 20 μm. However, embodiments of the present disclosure are not necessarily limited thereto. A thickness of the second upper solder resist pattern 114B may be greater than a thickness of the first upper solder resist pattern 114A. For example, the thickness of the second upper solder resist pattern 114B may be in the range of about 1.1 to about 1.5 times the thickness of the first upper solder resist pattern 114A.

The third upper solder resist pattern 114C may be disposed on the second upper solder resist pattern 114B (e.g., directly thereon in the Z-axis direction). The third upper solder resist pattern 114C may be disposed only in the outer region R3. For example, the third upper solder resist pattern 114C may not be disposed in the chip mounting region R1 and the interconnection region R2. The third upper solder resist pattern 114C may be a structure for adjusting a distance (e.g., length in the Z-axis direction) between the lower substrate 110 and the upper substrate 130. By adjusting the thickness of the third upper solder resist pattern 114C, the thickness of the vertical connection structure 140 electrically connecting the upper and lower substrates 110 and 130 to each other may be adjusted. The thickness of the vertical connection structure 140 may refer to a length of the vertical connection structure 140 in a direction perpendicular to the upper surface of the lower substrate 110, that is, for example, in the Z-axis direction. In an embodiment, the upper surface of the third upper solder resist pattern 114C may be disposed on a level higher than the first level of the vertical connection structure 140 that has a maximum width. For example, the upper surface of the third upper solder resist pattern 114C may be disposed on a third level higher than the first level. Referring to FIG. 10A, the upper surface of the third upper solder resist pattern 114C may be disposed on a level higher than a level of an upper surface of the lower connection structure 140A. In an embodiment, the thickness of the third upper solder resist pattern 114C (e.g., length in the Z-axis direction) may be substantially the same as (e.g., equal to) the thickness of the encapsulant 150. A thickness of the third upper solder resist pattern 114C may be greater than a thickness of each of the first and second upper solder resist patterns 114A and 114B. In an embodiment, the thickness of the third upper solder resist pattern 114C may be, for example, within the range of about 150 μm to about 250 μm. However, embodiments of the present disclosure are not necessarily limited thereto. In an embodiment, the third upper solder resist pattern 114C may be in direct contact with at least a portion of the upper substrate 130. An upper surface of the third upper solder resist pattern 114C may be in direct contact with a lower surface of the upper substrate 130. A lower surface of the third upper solder resist pattern 114C may be in direct contact with an upper surface of the second upper solder resist pattern 114B. In an embodiment, the thickness of the third upper solder resist pattern 114C (e.g., length in the Z-axis direction) may be substantially the same as (e.g., equal to) the thickness of the encapsulant 150.

Referring to FIG. 1A, in an embodiment the third upper solder resist pattern 114C may include a single pattern continuously extending along side surfaces of the outer region R3. Accordingly, the pattern may be uniformly disposed on the outer region R3. The third upper solder resist pattern 114C may be disposed on a region adjacent to the first surface S1 of the interconnection region R2 and a surface parallel to the first surface S1, and on a region adjacent to the second surface S2 perpendicular to the first surface S1 and a surface parallel to the second surface S2. For example, the third upper solder resist pattern 114C may be continuously disposed on four surfaces of the outer region R3. In embodiments in which the lower substrate 110 has a non-rectangular structure, the third upper solder resist pattern 114C may be disposed on all surfaces of the outer region R3. The third upper solder resist pattern 114C may be formed in various shapes by a patterning process on the second upper solder resist pattern 114B, such that the dispositional relationship may be adjusted according to the position of the vertical connection structure 140.

The third upper solder resist pattern 114C may be uniformly disposed in the outer region R3 adjacent to the interconnection region R2 in which the vertical connection structure 140 is disposed, such that the vertical connection structure 140 may have increased electrical performance. For example, as the third upper solder resist pattern 114C maintains the distance between the upper and lower substrates 130 and 110 to be constant, the plurality of vertical connection structures 140 may have a uniform thickness. Also, as the thicknesses of the plurality of vertical connection structures 140 are uniformly maintained, the shifting of the vertical connection structure 140 in a direction perpendicular to the Z-axis direction, such as, for example, an X-axis direction, may decrease and a short between vertical connection structures adjacent to each other may be prevented. Further, as the third upper solder resist pattern 114C is disposed, to adjust the thickness of the vertical connection structure 140, a dummy connection structure including a structure similar to that of the vertical connection structure 140, such as, for example, a core ball including copper (Cu), may not be provided.

In an embodiment, the third upper solder resist pattern 114C may include the same material as the material of the first and second upper solder resist patterns 114A and 114B. However, embodiments of the present disclosure are not necessarily limited thereto and the third upper solder resist pattern 114C may include a different material in some embodiments. However, even though the third upper solder resist pattern 114C may include the same material as the first and second upper solder resist patterns 114A and 114B, as the third upper solder resist pattern 114C is formed by a different process, the boundary therebetween may be distinct.

The semiconductor chip 120 may be disposed on the lower substrate 110 and may be electrically connected to the lower wiring layer 112. In an embodiment, the semiconductor chip 120 may be mounted on the lower substrate 110 by a flip-chip method. The semiconductor chip 120 may be connected to the lower wiring layer 112 through metal bumps in the form of balls and/or posts. In an embodiment, the metal bump may include an upper metal bump 121A and a lower metal bump 121B. The upper metal bump 121A may include copper (Cu), and the lower metal bump 121B may include tin (Sn). The upper metal bump 121A may have a post shape connected to the pad of the semiconductor chip 120, and the lower metal bump 121B may have a ball shape connected to the upper metal bump 121A. However, the shape of the metal bump is not necessarily limited thereto, and in some embodiments, the semiconductor chip 120 may be directly connected to the lower wiring layer 112 or the lower wiring via 113 without a bump, or may be mounted on the lower substrate 110 by a wire bonding method. In an embodiment, the semiconductor chip 120 may include silicon (Si), germanium (Ge), or gallium arsenide (GaAs), and various types of integrated circuits may be formed therein. In an embodiment, the integrated circuit may be a processor chip such as a central processor (e.g., CPU), a graphics processor (e.g., GPU), a field programmable gate array (FPGA), an application processor (AP), a digital signal processor, an encryption processor, a microprocessor, a microcontroller, or the like. However, embodiments of the present disclosure are not necessarily limited thereto, and the integrated circuit may be a logic chip such as an analog-to-digital converter and an application-specific IC (ASIC), or a memory chip such as a volatile memory (e.g., DRAM), and a non-volatile memory (e.g., ROM and flash memory).

In an embodiment, the semiconductor package 100 may further include an underfill resin 122 covering the lower surface of the semiconductor chip 120. The underfill resin 122 may fill spaces between the lower substrate 110 and the semiconductor chip 120 on the chip mounting region R1 of the lower substrate 110. The underfill resin 122 may extend to at least a portion of a lateral side surface of the semiconductor chip 120 while covering the upper surface of the first upper solder resist pattern 114A and the metal bump. The underfill resin 122 may be in direct contact with at least a portion of a lateral side surface of the second upper solder resist pattern 114B. In an embodiment, the underfill resin 122 may not extend to the interconnection region R2 of the lower substrate 110 by the second upper solder resist pattern 114B. The underfill resin 122 may be spaced apart from the third upper solder resist pattern 114C.

In an embodiment, the upper substrate 130 may be a redistribution substrate providing a redistribution layer on the upper surface or the rear surface of the semiconductor package 100, and may be referred to as an interposer substrate disposed between a lower package and an upper package in a package-on-package structure. The upper substrate 130 may cover the semiconductor chip 120 disposed on the lower substrate 110. The lower surface of the upper substrate 130 may be adjacent to the semiconductor chip 120. The upper substrate 130 may include at least one upper insulating layer 131, at least one upper wiring layer 132, and at least one upper wiring via 133. The upper insulating layer 131, the upper wiring layer 132, and the upper wiring via 133 may be configured the same as or similarly to the lower insulating layer 111, the lower wiring layer 112, and the lower wiring via 113 of the lower substrate 110 described above, and thus, overlapping descriptions will not be provided for convenience of explanation. In an embodiment, the upper substrate 130 may further include solder resist layers 134 covering the uppermost and lowermost upper wiring layers 132 and protecting the layers from external physical/chemical damages, and the solder resist layers 134 may be formed using prepreg, ABF, FR-4, BT, or PSR, for example. However, embodiments of the present disclosure are not necessarily limited thereto. In an embodiment, the upper substrate 130 may further include a pattern layer 135 disposed on a lower surface of the solder resist layer 134 covering the lowermost upper wiring layer 132. The pattern layer 135 may fill a space between the semiconductor chip 120 and the upper substrate 130 which may be formed due to a difference in thicknesses between the third upper solder resist pattern 114C and the semiconductor chip 120 to increase the structural stability of the semiconductor package 100. An upper surface of the pattern layer 135 may be in direct contact with the upper substrate 130, and a lower surface of the pattern layer 135 may be in direct contact with an upper surface of the semiconductor chip 120. The pattern layer 135 may include an insulating material, and may include the same material as that of the solder resist layers 134. In an embodiment, the pattern layer 135 may be formed by a process separate from the process of forming the solder resist layers 134. However, embodiments of the present disclosure are not limited thereto, and the pattern layer 135 may be formed to be integrated with the solder resist layers 134 and by a same process.

The vertical connection structure 140 may electrically connect the lower substrate 110 to the upper substrate 130. The vertical connection structure 140 may be disposed between the lower substrate 110 and the upper substrate 130. The lower end of the vertical connection structure 140 may be in direct contact with the uppermost lower wiring layer 112 of the lower substrate 110, and the upper end of the vertical connection structure 140 may be in direct contact with the lowermost upper wiring layer 132. In an embodiment, the vertical connection structure 140 may have a spherical or ball shape formed of a low-melting-point metal such as, for example, tin (Sn), indium (In), bismuth (Bi), antimony (Sb), copper (Cu), silver (Ag), zinc (Zn), and lead (Pb).) or an alloy (e.g., Sn—Ag—Cu) including the above elements. The vertical connection structure 140 may have a hole shape including an outwardly curved side surface between the lower substrate 110 and the upper substrate 130. Referring to FIG. 10A, a first level of a lateral side surface having a maximum width among the outwardly curved side surfaces may be the same as or lower than a level of the uppermost portion of the lower connection structure 140A.

In an embodiment, the vertical connection structure 140 may be disposed on the interconnection region R2. In the interconnection region R2, the vertical connection structure 140 may cover the exposed upper surface of the uppermost lower wiring layer 112 and lateral side surfaces of the first and second upper solder resist patterns 114A and 114B. Accordingly, the vertical connection structure 140 may penetrate the first and second upper solder resist patterns 114A and 114B.

In an embodiment, referring to FIG. 1A, the vertical connection structure 140 may be disposed adjacent to two surfaces of the interconnection region R2, that is, for example, the first surface S1 and the surface opposing the first surface S1 (e.g., in the X-axis direction). However, embodiments of the present disclosure are not necessarily limited thereto and the vertical connection structure 140 may be disposed on four surfaces of the interconnection region R2.

In an embodiment, by including a third upper solder resist pattern 114C uniformly disposed on the outer region R3, which is a region adjacent to the vertical connection structure 140 on the interconnection region R2, a semiconductor package having a package-on-package structure in which errors occurring in the process of forming the vertical connection structure 140 may be prevented, and which may have increased electrical performance may be provided.

The encapsulant 150 may fill spaces between the lower substrate 110 and the upper substrate 130, and may encapsulate at least a portion of each of the semiconductor chip 120 and the vertical connection structure 140. In an embodiment, the encapsulant 150 may include, for example, a thermosetting resin such as an epoxy resin, a thermoplastic resin such as polyimide, or prepreg, Ajinomoto build-up film (ABF), FR-4, bismaleimide triazine (BT), epoxy molding compound (EMC) including an inorganic filler and/or glass fiber. However, embodiments of the present disclosure are not necessarily limited thereto. In an embodiment, the encapsulant 150 may have a capillary underfill (CUF) structure in which a boundary from the underfill resin 122 may be distinct, but may also have a molded underfill (MUF) structure integrated with the underfill resin 122 in some embodiments.

The connection bump 160 may be disposed below the lower substrate 110 and may be electrically connected to the lower wiring layer 112. The connection bump 160 may physically and/or electrically connect the semiconductor package 100 to an external device. In an embodiment, the connection bump 160 may include a conductive material and may have a ball shape, a pin shape, or a lead shape. For example, the connection bump 160 may be a solder ball. In an embodiment, at least one passive device 170 disposed adjacently to the connection bump 160 may be disposed below the lower substrate 110. In an embodiment, the passive device 170 may include, for example, a capacitor such as a multilayer ceramic capacitor (MLCC) or a low inductance chip capacitor (LICC), an inductor, and beads. In an embodiment, the passive device 170 may be a land-side capacitor (LSC). However, embodiments of the present disclosure are not necessarily limited thereto, and in some embodiments, the passive device 170 may be a die-side capacitor (DSC) mounted on the upper surface of the lower substrate 110 or an embedded type capacitor embedded in the lower substrate 110.

Figure 2:
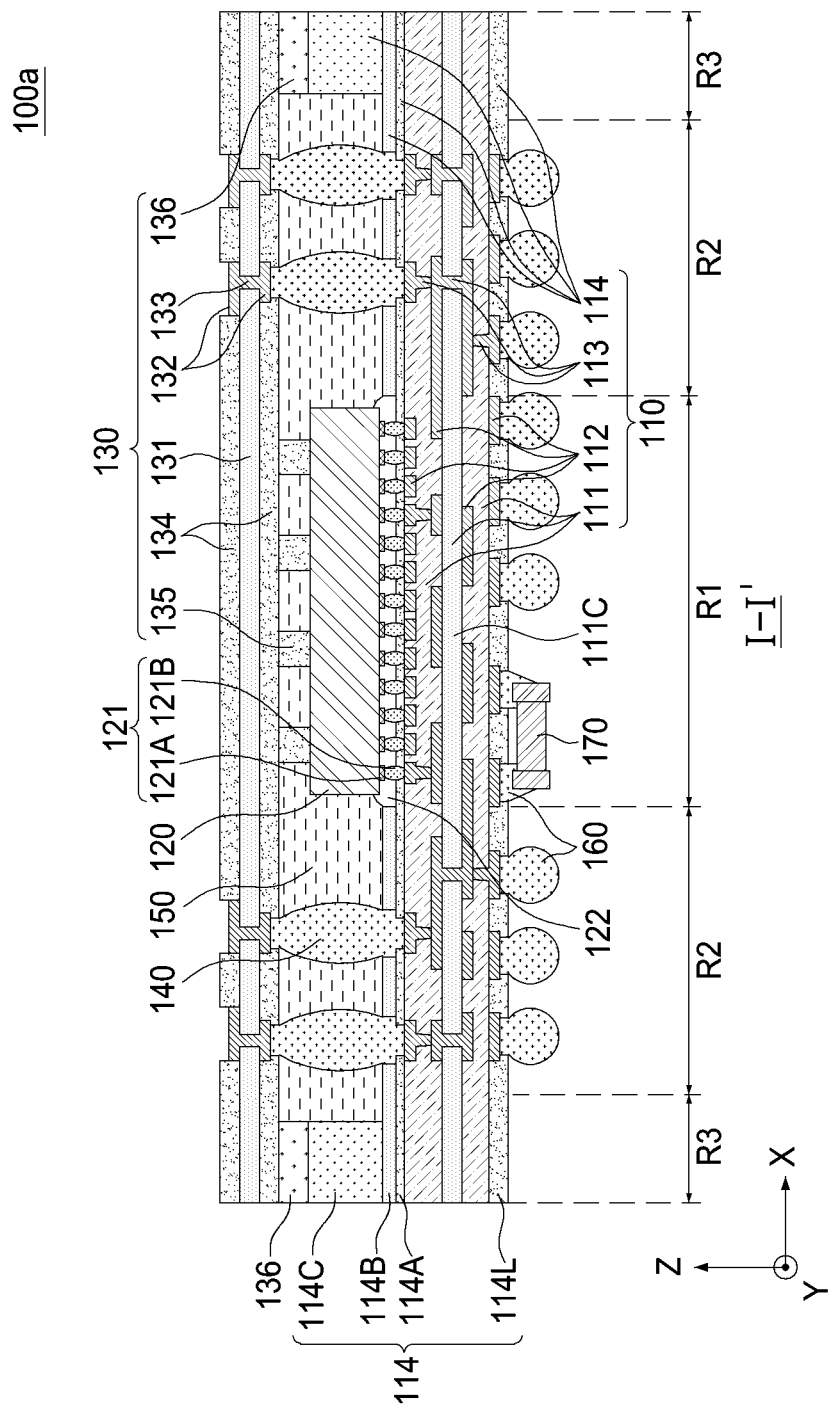
FIG. 2 is a cross-sectional view taken along line I-I' of FIG. 1A illustrating a semiconductor package according to an embodiment of the present disclosure.

FIG. 2 is a cross-sectional diagram illustrating a semiconductor package 100a according to an embodiment, taken along line I-I' in FIG. 1A.

Referring to FIG. 2, the semiconductor package 100a according to an embodiment may be configured the same as or similarly to an embodiment described with reference to FIGS. 1A and 1B, other than the configuration in which the upper substrate 130 may further include a fourth solder resist pattern 136 disposed on a lower end of the upper substrate 130. The fourth solder resist pattern 136 may be disposed on a lower surface of the solder resist layer 134 covering the lowermost upper wiring layer 132. The fourth solder resist pattern 136 may be disposed on an upper surface of the third upper solder resist pattern 114C. In an embodiment, the fourth solder resist pattern 136 may include the same material as that of the pattern layer 135. However, embodiments of the present disclosure are not necessarily limited thereto. The lower surface of the fourth solder resist pattern 136 may be in direct contact with the upper surface of the third upper solder resist pattern 114C, and may function the same as the third upper solder resist pattern 114C described in the aforementioned embodiments with reference to FIGS. 1A and 1B together with the third upper solder resist pattern 114C. For example, in the process of forming the vertical connection structure 140, the third upper solder resist pattern 114C and the fourth solder resist pattern 136 may be in direct contact with each other, and the lower connection structure 140A of the lower substrate 110 may be connected to the upper connection structure 140B of the upper substrate 130, thereby forming the vertical connection structure 140. Accordingly, the third upper solder resist pattern 114C and the fourth solder resist pattern 136 may be configured to adjust the length of the vertical connection structure 140. In an embodiment, the thickness (e.g., length in the Z-axis direction) of the third upper solder resist pattern 114C may be greater than the thickness of the fourth solder resist pattern 136. However, embodiments of the present disclosure are not limited thereto and the thickness of the third upper solder resist pattern 114C may vary. The thickness of the third upper solder resist pattern 114C may be configured to be further reduced in embodiments. The sum of the thicknesses of the third upper solder resist pattern 114C and the fourth solder resist pattern 136 may be substantially equal to the thickness of the encapsulant 150. In embodiments of the present disclosure, the third upper solder resist pattern 114C and the fourth solder resist pattern 136 may be referred to as a lower solder resist spacer and an upper solder resist spacer.

In an embodiment, the semiconductor package may only include the fourth solder resist pattern 136 without including the third upper solder resist pattern 114C. In this embodiment, the fourth solder resist pattern 136 may have a structure the same as or similar to that of the third upper solder resist pattern 114C in embodiments of FIGS. 1A and 1B.

Figure 3:
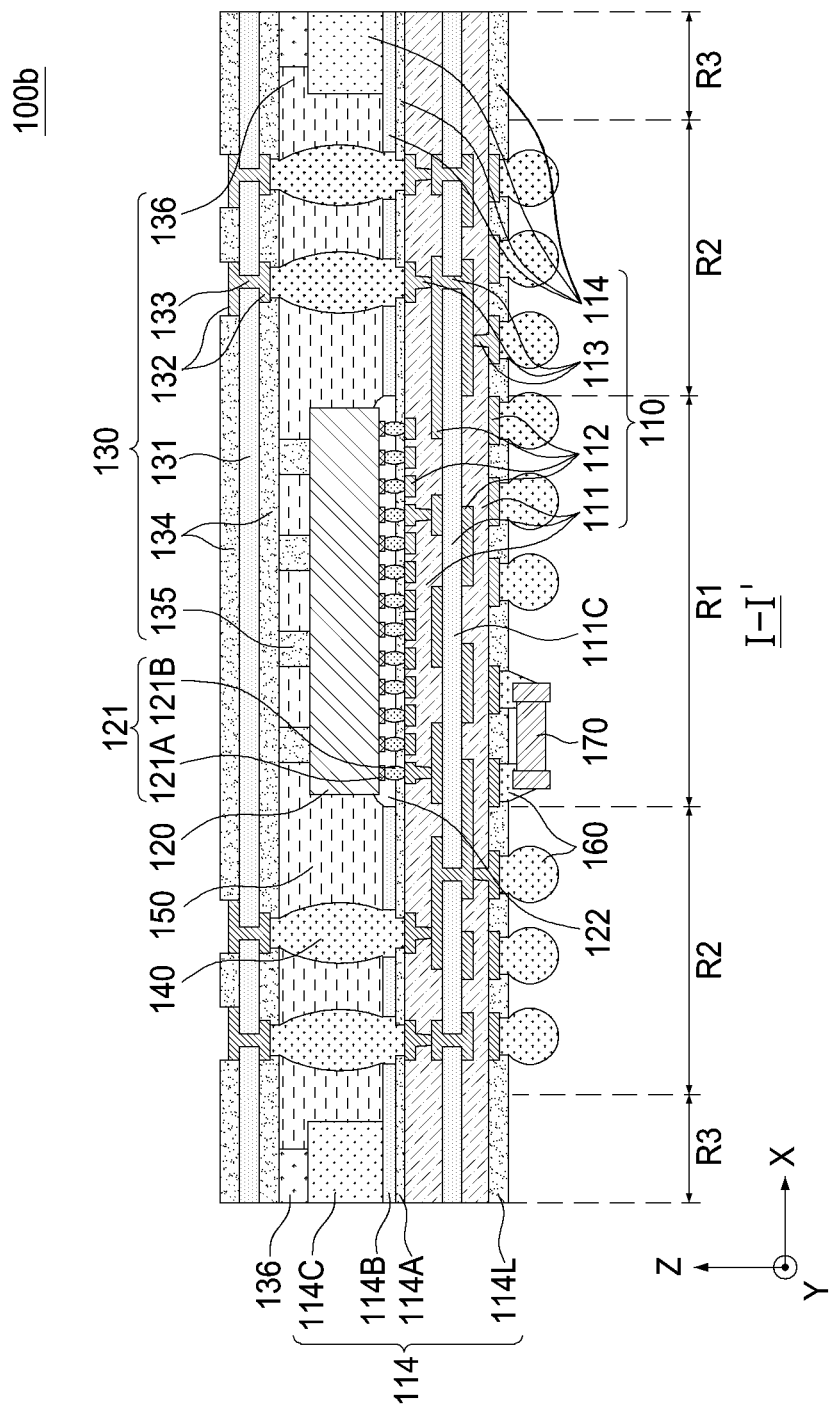
FIG. 3 is a cross-sectional view taken along line I-I' of FIG. 1A illustrating a semiconductor package according to an embodiment of the present disclosure.

FIG. 3 is a cross-sectional diagram illustrating a semiconductor package 100b according to an embodiment, taken along line I-I' in FIG. 1A.

Referring to FIG. 3, the semiconductor package 100c may be configured the same as or similarly to an embodiment described with reference to FIG. 2, other than the structure of the fourth solder resist pattern 136. The fourth solder resist pattern 136 and the third upper solder resist pattern 114C may not have the same pitch. For example, on a plane, the third upper solder resist pattern 114C may include a portion not overlapping the fourth solder resist pattern 136 (e.g., in the Z-axis direction). A planar area of the fourth solder resist pattern 136 disposed on the third upper solder resist pattern 114C may be adjusted if desired. Also, even when the fourth solder resist pattern 136 and the third upper solder resist pattern 114C are configured to have the same planar area, since the third upper solder resist pattern 114C and the fourth solder resist pattern 136 may be formed by different processes, such as, for example, the process of forming the lower substrate 110 and the process of forming the upper substrate 130, the planar areas may be different or may not be aligned. Accordingly, the minimum distance between the third upper solder resist pattern 114C and the vertical connection structure 140 may be different from the minimum distance between the fourth solder resist pattern 136 and the vertical connection structure 140.

Figure 4:
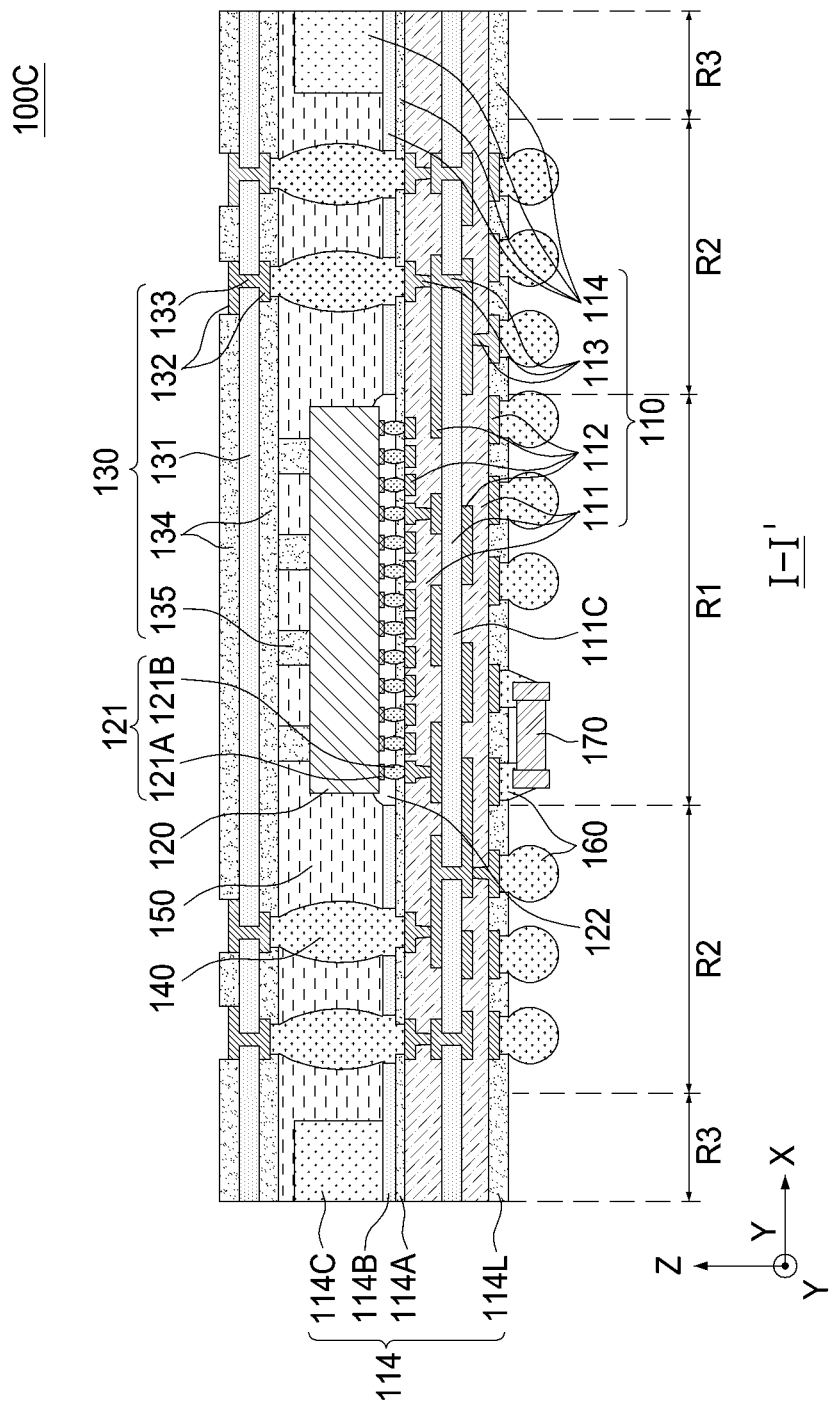
FIG. 4 is a cross-sectional view taken along line I-I' of FIG. 1A illustrating a semiconductor package according to an embodiment of the present disclosure.

FIG. 4 is a cross-sectional diagram illustrating a semiconductor package 100c according to an embodiment, taken along line I-I' in FIG. 1A.

Referring to FIG. 4, the semiconductor package 100c may be configured the same as or similarly to an embodiment described with reference to FIGS. 1A and 1B, other than the structure of the third upper solder resist pattern 114C. At least a portion of the upper surface of the third upper solder resist pattern 114C, may be spaced apart from the lower surface of the upper substrate 130 (e.g., in the Z-axis direction). Accordingly, at least a portion of the upper surface of the third upper solder resist pattern 114C may not be in direct contact with the lower surface of the upper substrate 130, and a space between the third upper solder resist pattern 114C and the upper substrate 130 may be filled with the encapsulant 150. In an embodiment, the entire upper surface of the third upper solder resist pattern 114C may be spaced apart from the upper substrate 130. However, embodiments of the present disclosure are not necessarily limited thereto. For example, in some embodiments, only a portion of the upper surface of the third upper solder resist pattern 114C may be spaced apart from the upper substrate 130. However, even in this embodiment, the third upper solder resist pattern 114C may function as a support structure for preventing over-pressing and shifting of the vertical connection structure 140, thereby providing the semiconductor package 100c having increased reliability.

In embodiments of the present disclosure in which the semiconductor package includes only the fourth solder resist pattern 136 as described with reference to FIG. 2, the lower surface of the fourth solder resist pattern 136 may be spaced apart from the upper surface of the lower substrate 110 (e.g., in the Z-axis direction).

Figure 5:
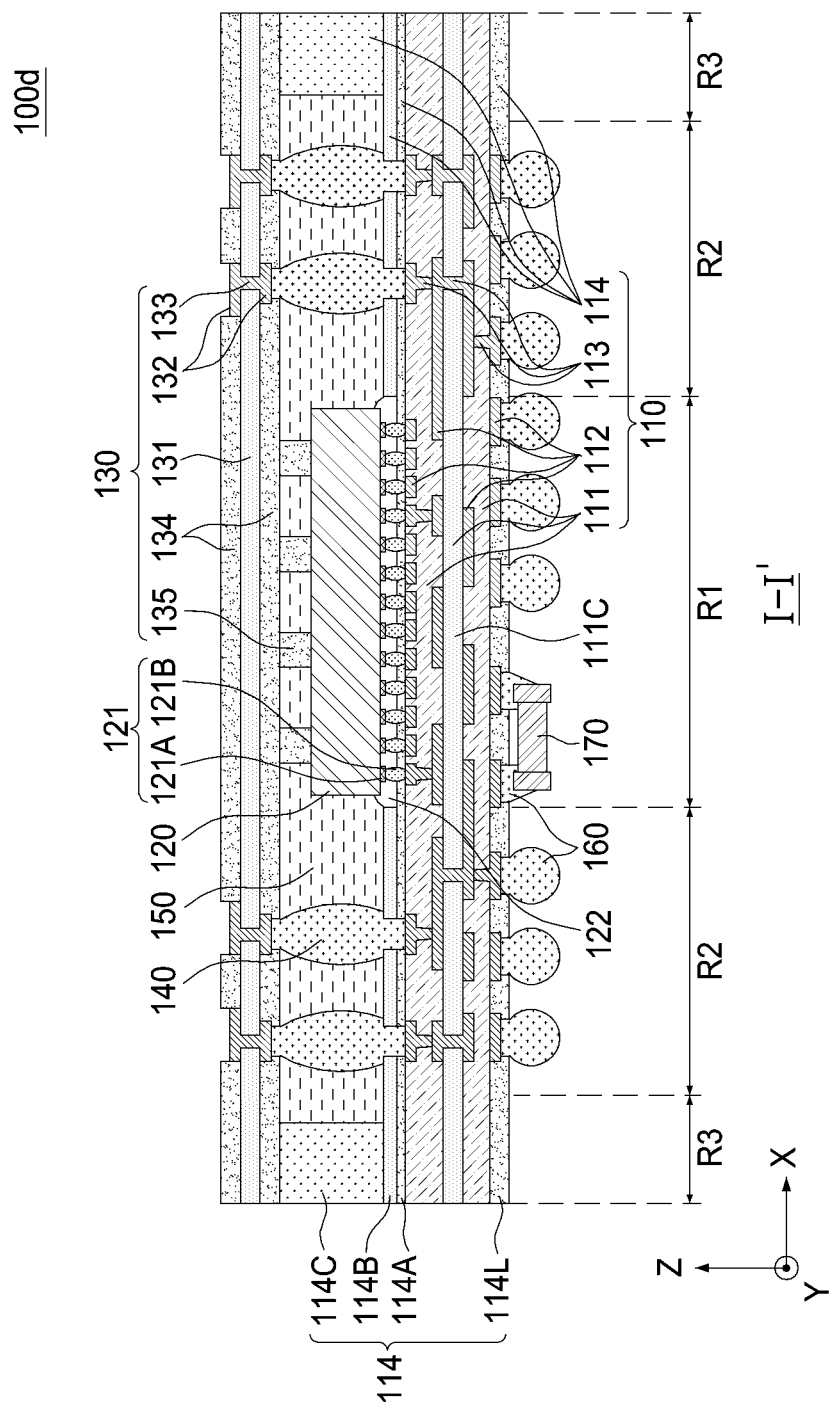
FIG. 5 is a cross-sectional view taken along line I-I' of FIG. 1A illustrating a semiconductor package according to an embodiment of the present disclosure.

FIG. 5 is a cross-sectional diagram illustrating a semiconductor package 100d according to an embodiment, taken along line I-I' in FIG. 1A.

Referring to FIG. 5, the semiconductor package 100d may include a second upper solder resist pattern 114B different from embodiments described with reference to FIGS. 1A and 1B. In the interconnection region R2, the second upper solder resist pattern 114B may completely overlap the first upper solder resist pattern 114A (e.g., in the Z-axis direction). For example, the width of the opening of the second upper solder resist pattern 114B in the interconnection region R2 may be the same as the width of the opening of the first upper solder resist pattern 114A. Accordingly, a step difference may not be formed between the first and second upper solder resist patterns 114A and 114B.

Figure 6:
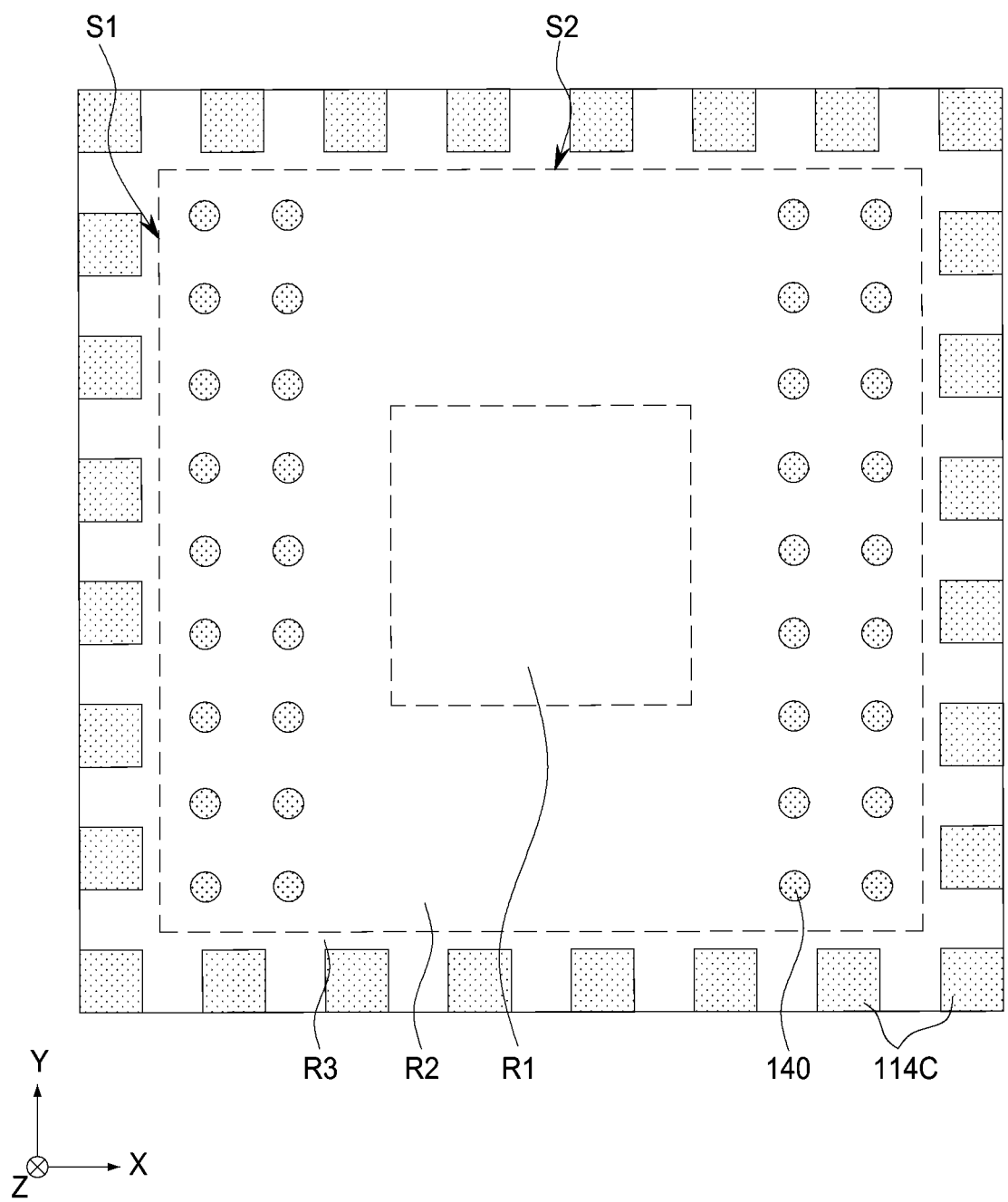
FIG. 6 is a plan view illustrating a semiconductor package according to an embodiment of the present disclosure.

FIG. 6 is a plan diagram illustrating a semiconductor package 100e according to an embodiment.

Referring to FIG. 6, the third upper solder resist pattern 114C of the semiconductor package 100e may include a plurality of patterns spaced apart from each other on the outer region R3. In an embodiment, each of the plurality of patterns may have substantially the same size and may be spaced apart from each other with substantially the same distance therebetween. However, embodiments of the present disclosure are not necessarily limited thereto, and the size and dispositional relationship of the plurality of patterns may be varied in some embodiments. For example, in an embodiment, each of the plurality of patterns may be disposed in a curved line shape on an edge of the outer region R3. The third upper solder resist pattern 114C disposed on the second upper solder resist pattern 114B may have various shapes and structures through a patterning process. Accordingly, the third resist pattern 114C may include various types of patterns on the outer region R3 in consideration of the positional relationship with the vertical connection structures 140.

Figure 7A:
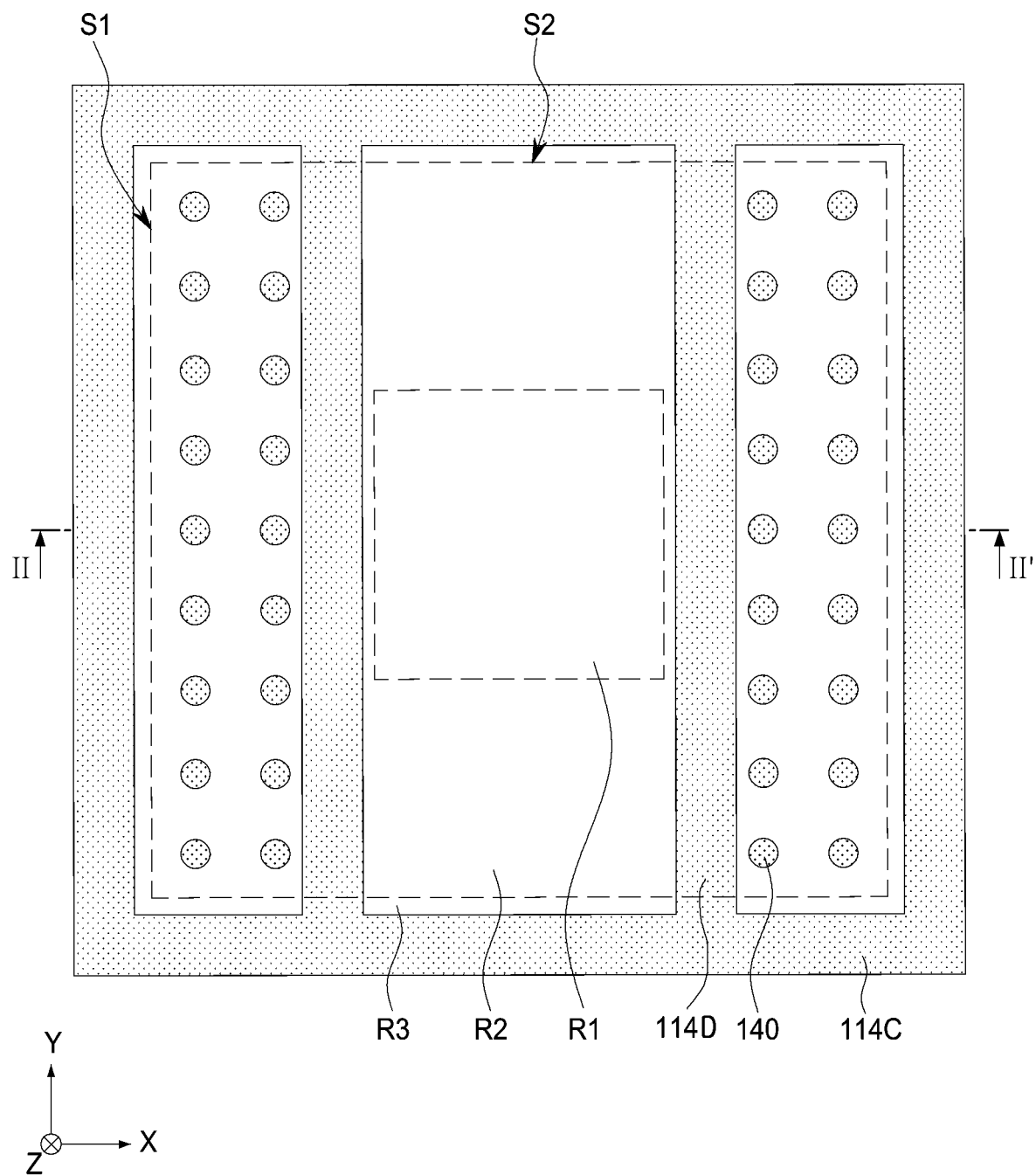
FIG. 7A is a plan view of a semiconductor package according to an embodiment of the present disclosure.
Figure 7B:
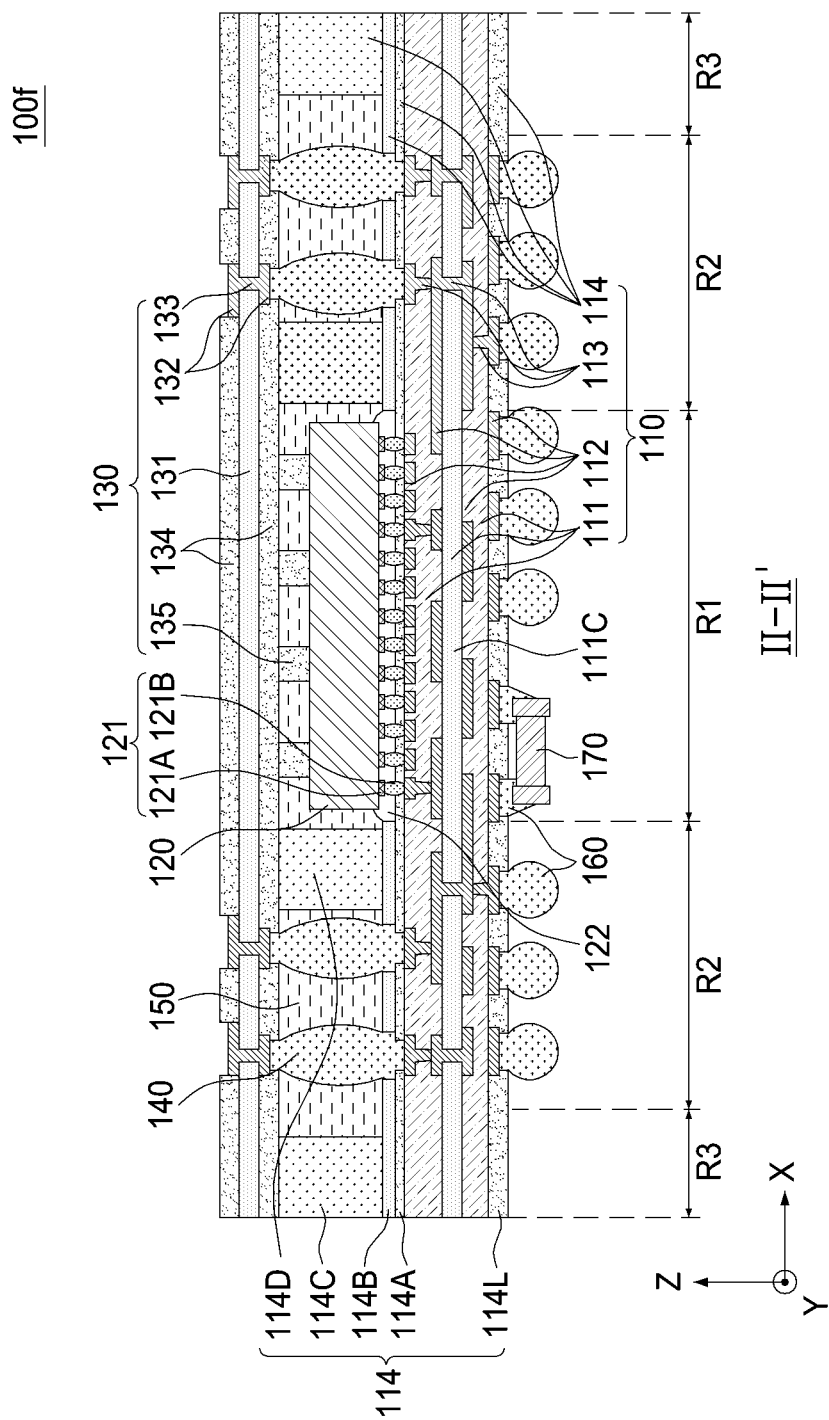
FIG. 7B is a cross-sectional view taken along line II-II' of FIG. 7A illustrating a semiconductor package according to an embodiment of the present disclosure.

FIGS. 7A and 7B are a plan diagram and a cross-sectional diagram illustrating a semiconductor package 100f according to an embodiment. FIG. 7B is a cross-sectional diagram taken along line II-II' of FIG. 7A. FIG. 7A is a plan diagram illustrating the dispositional relationship among a chip mounting region R1, an interconnection region R2, and an outer region R3 without including components such as an upper substrate 130.

Referring to FIGS. 7A and 7B, the lower substrate 110 of the semiconductor package 100f according to embodiments of the present disclosure may further include a fourth solder resist pattern 114D disposed in the interconnection region R2. The fourth solder resist pattern 114D may have the same structure as that of the third upper solder resist pattern 114C other than the configuration in which the fourth solder resist pattern 114D may be disposed in the interconnection region R2. The fourth solder resist pattern 114D may be disposed on the second upper solder resist pattern 114B (e.g., disposed directly thereon in the Z-axis direction). The lower end may be in direct contact with the upper surface of the second upper solder resist pattern 114B, and the upper end may be in direct contact with the upper substrate 130. The fourth solder resist pattern 114D may control the distance between the upper and lower substrates 130 and 110 and the thickness of the vertical connection structure 140 together with the third upper solder resist pattern 114C. The third upper solder resist pattern 114C disposed in the outer region R3 and the fourth solder resist pattern 114D disposed in the interconnection region R2 may increase uniformity of the levels of the vertical connection structures 140 disposed between the third and fourth solder resist patterns 114C and 114D. The fourth solder resist pattern 114D may not include a region overlapping the vertical connection structure 140 and the semiconductor chip 120 on a plane. In embodiments of the present disclosure, the fourth solder resist pattern 114D may be referred to as an auxiliary solder resist spacer.

Figure 8:
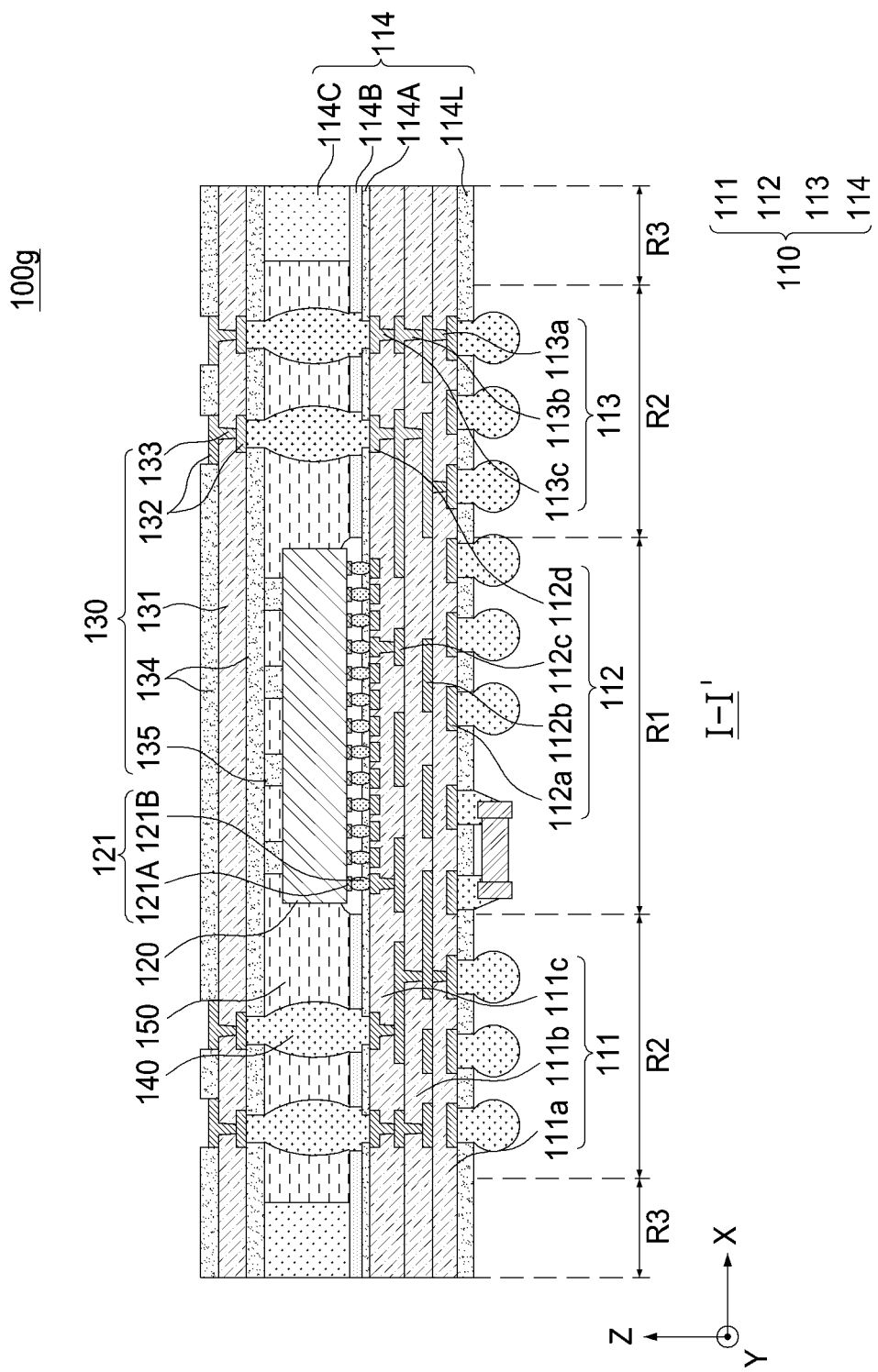
FIG. 8 is a cross-sectional view taken along line I-I' of FIG. 1A illustrating a semiconductor package according to an embodiment of the present disclosure.

FIG. 8 is a cross-sectional diagram illustrating a semiconductor package 100g according to an embodiment, taken along line I-I' in FIG. 1A.

Referring to FIG. 8, the semiconductor package 100g according to an embodiment may be configured the same as or similarly to embodiments described with reference to FIGS. 1A and 7B, other than the configuration in which the semiconductor package 100g may include a lower substrate 110 and/or an upper substrate 130 which do not include a core insulating layer. In an embodiment, the lower substrate 110 may include a first lower wiring layer 112a, a first lower insulating layer 111a covering the first lower wiring layer 112a, a second lower wiring layer 112b on the first lower insulating layer 111a, a second lower insulating layer 111b on the first lower insulating layer 111a covering the second lower wiring layer 112b, a third lower insulating layer 111c on the second lower insulating layer 111b covering the third lower wiring layer 112c, a fourth lower wiring layer 112d disposed on the upper surface of the third lower insulating layer 111c, and first to third lower wiring vias 113a, 113b, and 113c penetrating the first to third lower insulating layers 111a, 111b, and 111c, respectively, and electrically connecting the first to third lower wiring layers 112a, 112b, 112c, and 112d to each other. In an embodiment, the first to third lower insulating layers 111a, 111b, and 111c may include a photosensitive resin (e.g., PID), and a thickness of the lower substrate 110 may be reduced as compared to the substrate including the core insulating layers, and the lower wiring layers 112a, 112b, 112c, and 112d having a fine pitch may be formed. The number of layers of the lower insulating layers and the number of layers of the lower wiring layers 112a, 112b, 112c, and 112d are not limited to any particular example, and may be greater or smaller than the embodiment illustrated in the drawings. Similarly to the lower substrate 110, the upper substrate 130 may also be formed by stacking photosensitive resins. Accordingly, according to an embodiment, the thickness of the lower substrate 110 and the upper substrate 110 may be reduced, and the overall thickness of the semiconductor package 100g may be reduced.

Figure 9:
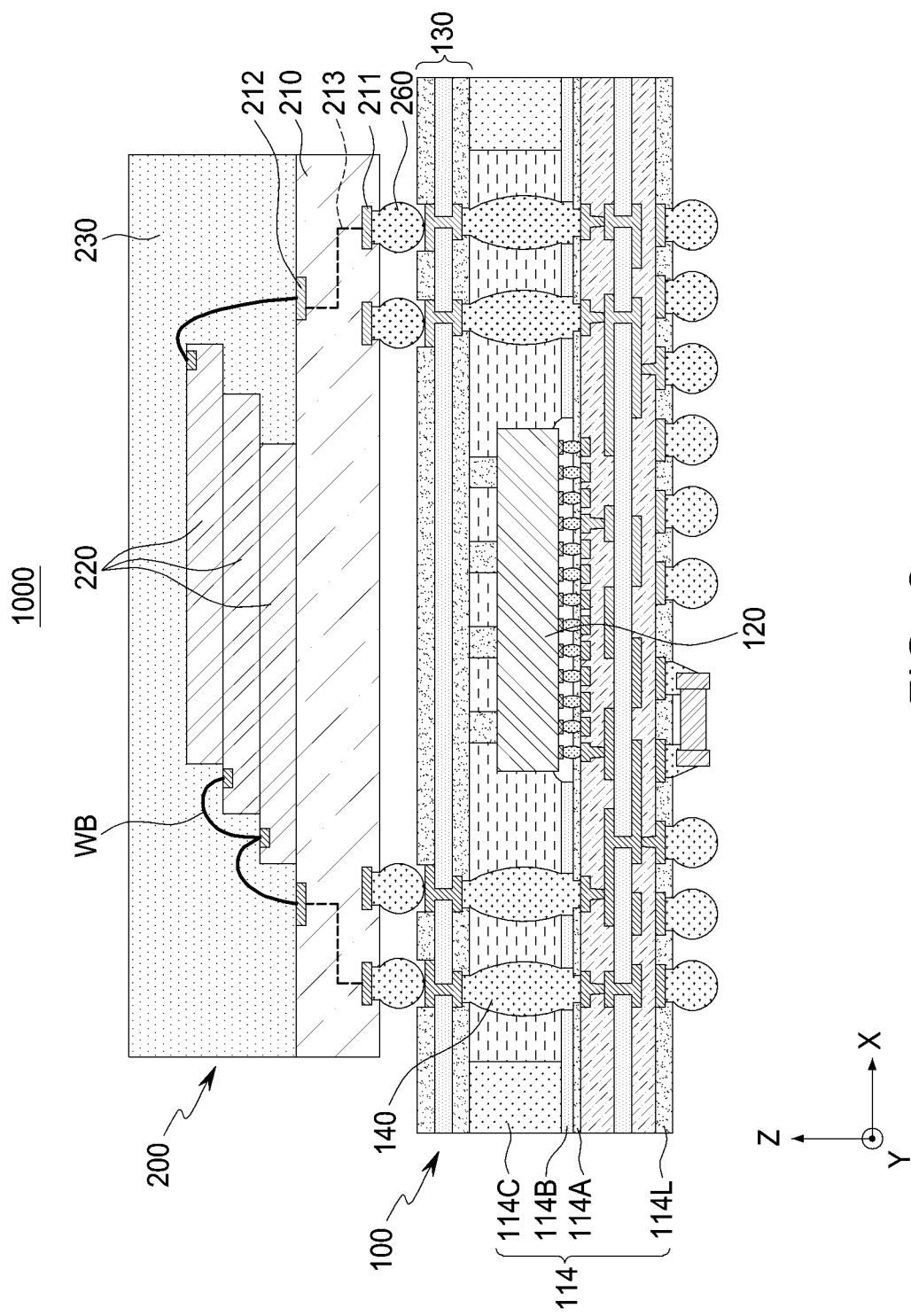
FIG. 9 is a cross-sectional diagram illustrating a semiconductor package according to an embodiment of the present disclosure.

FIG. 9 is a cross-sectional diagram illustrating a semiconductor package 1000 according to an embodiment.

Referring to FIG. 9, the semiconductor package 1000 may include a first package 100 and a second package 200. The first package 100 may be configured the same as the semiconductor package 100 illustrated in an embodiment of FIG. 1B, or may be configured the same as or similarly to embodiments of the semiconductor packages 100, 100a, 100b, 100c, 100d, 100e, 100f, and 100g described with reference to FIGS. 1A to 8. For example, the first package 100 may include the semiconductor chip 120, and the semiconductor chip 120 may have the same structure as that of the semiconductor chip 120 in embodiments of FIGS. 1A to 8.

The second package 200 may include a redistribution substrate 210, at least one second semiconductor chip 220, and a second encapsulant 230. The redistribution substrate 210 may include a lower pad 211 and an upper pad 212 electrically connected to an external entity on the lower surface and the upper surface thereof, respectively. Also, the redistribution substrate 210 may include a redistribution circuit 213 electrically connecting the lower pad 211 to the upper pad 212.

The second semiconductor chip 220 may be mounted on the redistribution substrate 210 by wire bonding or flip-chip bonding. In an embodiment in which a plurality of the second semiconductor chips 220 are provided, the plurality of second semiconductor chips 220 may be stacked in the Z-axis direction perpendicular to the upper surface of the redistribution substrate 210, and may be electrically connected to the upper pad 212 of the redistribution substrate 210 by a bonding wire WB. In an embodiment, the second semiconductor chip 220 may include a memory chip, and the first semiconductor chip 120 may include an AP chip. However, embodiments of the present disclosure are not necessarily limited thereto.

The second encapsulant 230 may include a material the same as or similar to the encapsulant 150 of the first package 100. The semiconductor package 1000 may further include a metal bump 260 physically and electrically connecting the first package 100 to the second package 200. The metal bump 260 may be electrically connected to the redistribution circuit 213 in the redistribution substrate 210 through the lower pad 211 of the redistribution substrate 210. In an embodiment, the metal bump 260 may include a low melting point metal, such as, for example, tin (Sn) or an alloy including tin (Sn).

The semiconductor package 1000 according to embodiments may include a vertical connection structure 140 having a uniform height, and may include a third upper solder resist pattern 114C supporting the vertical connection structure 140 in a region adjacent to the vertical connection structure 140. Accordingly, in embodiments, a package-on-package structure having increased electrical performance and excellent reliability may be implemented.

Figure 10B:
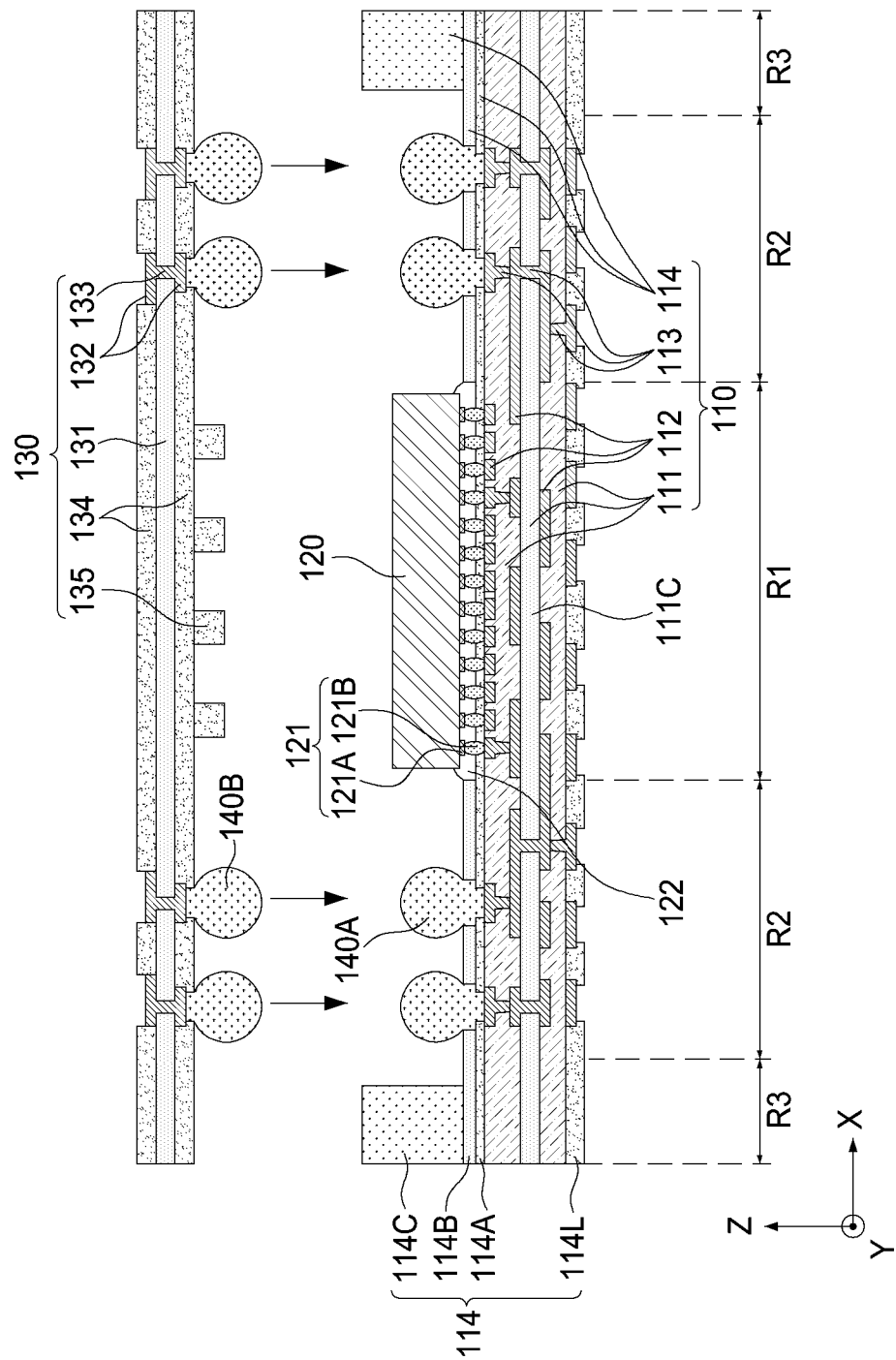
Figure 10C:
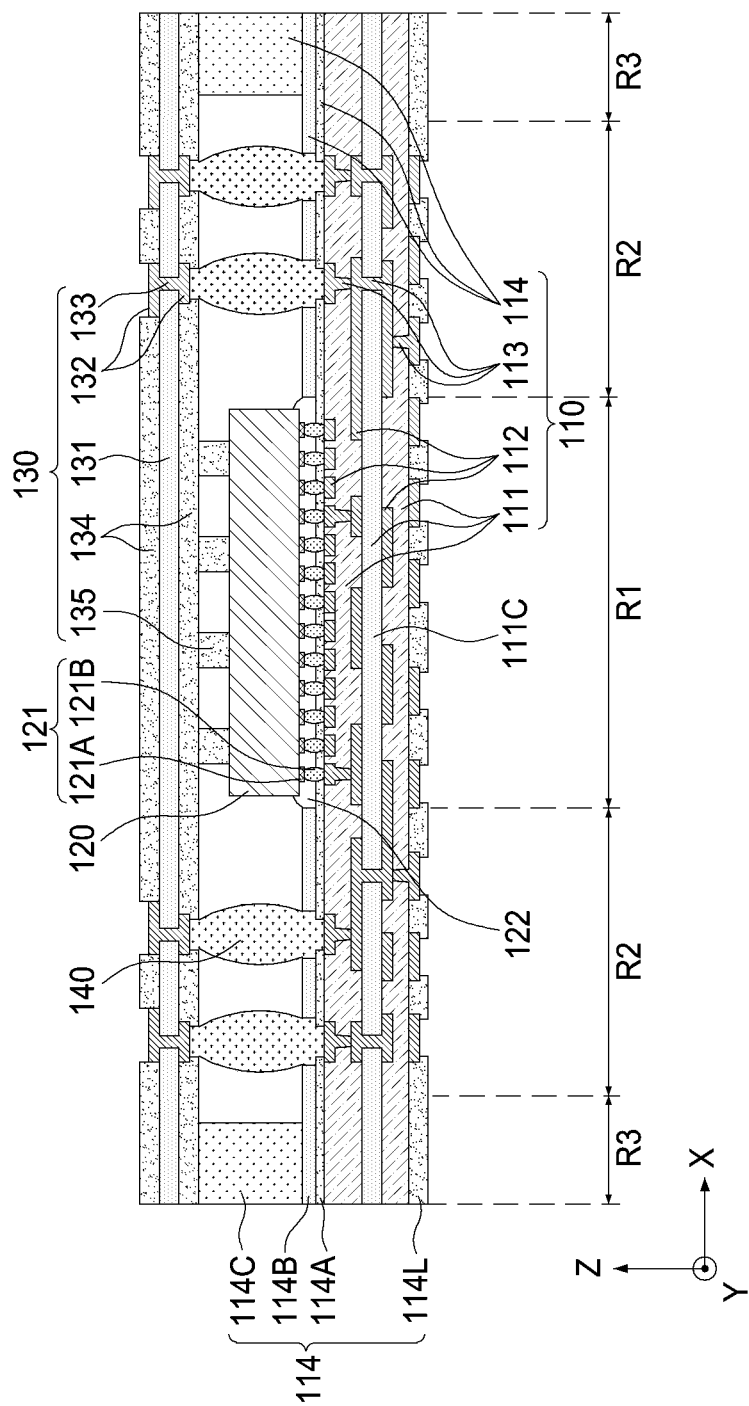

FIGS. 10A to 10C are diagrams illustrating sequential processes of a method of manufacturing a semiconductor package according to embodiments of the present disclosure.

Referring to FIG. 10A, a lower substrate 110 may be formed, and a semiconductor chip 120 may be mounted on a chip mounting region R1 of the lower substrate 110.

A preliminary lower substrate including a lower insulating layer 111, a lower wiring layer 112, and a lower wiring via 113 may be prepared. The lower insulating layer 1i1 may be formed using, for example, a copper clad laminate. In an embodiment, the lower wiring layer 112 and the lower wiring via 113 may be formed on both surfaces of the lower insulating layer 111 using a photolithography process, a plating process, an etching process, or the like. In an embodiment, a greater number of lower wiring layers may be formed by stacking additional insulating layers on both surfaces of the lower insulating layer 111, differently from the example illustrated in FIGS. 10A-10C.

Thereafter, solder resist layers 114 may be formed on the upper and lower surfaces of the preliminary lower substrate. The solder resist layers 114 may be formed by applying a solder resist ink (e.g., PSR ink) and performing an exposure process and a development process. The lower solder resist pattern 114L may cover at least a portion of the lowermost lower insulating layer 111 and the lowermost lower wiring layer 112 and may expose a portion of the lowermost lower wiring layer 112. The exposed lowermost lower wiring layer 112 may be a landing region to which the connection bump 160 (see FIG. 1B) may be connected through a subsequent process. The first upper solder resist pattern 114A may cover at least a portion of the uppermost lower insulating layer 111 and the uppermost lower wiring layer 112 and may expose a portion of the uppermost lower wiring layer 112. The exposed uppermost lower wiring layer 112 may be a landing region to which the semiconductor chip 120 and the lower connection structure 140A may be connected through a subsequent process. The second upper solder resist pattern 114B may be formed on the first upper solder resist pattern 114A in the interconnection region R2 and the outer region R3. The third upper solder resist pattern 114C may be formed on the second upper solder resist pattern 114A in the outer region R3.

Thereafter, the lower connection structure 140A may be formed on the landing region of the interconnection region R2. In an embodiment, the lower connection structure 140A may be formed by applying a solder paste including tin (Sn) or an alloy including tin (Sn). The lower connection structure 140A may have a spherical or ball shape. However, embodiments of the present disclosure are not necessarily limited thereto. The lower connection structure 140A may have a spherical shape covering the exposed upper surface of the uppermost lower wiring layer 112 and lateral side surfaces of the first and second upper solder resist patterns 114A and 114B. Accordingly, the level of the uppermost surface of the lower connection structure 140A may be higher than the level of the uppermost surface of the second upper solder resist pattern 114B. The third upper solder resist pattern 114C may be disposed adjacent to the lower connection structure 140A in the outer region R3. The level of the uppermost surface of the lower connection structure 140A may be lower than the level of the uppermost surface of the third upper solder resist pattern 114C.

Thereafter, the semiconductor chip 120 and the metal bump 121 electrically connected to the semiconductor chip may be disposed on the chip mounting region R1 of the lower substrate 101. The semiconductor chip 120 may be mounted and aligned on the lower substrate 110 such that the metal bumps 121 may directly contact the landing region of the chip mounting region R1 formed by the exposed lowermost lower wiring layer 112.

Referring to FIG. 10B, the upper substrate 130 may be formed on the lower substrate 110 on which the semiconductor chip 120 is mounted.

The semiconductor chip 120 and the metal bump 121 may be mounted and aligned on the lower substrate 110, and an underfill resin 122 may be formed between the semiconductor chip 120 and the first upper solder resist pattern 114A. In an embodiment, the underfill resin 122 may be formed through a reflow process, a thermocompression bonding process, or the like. However, embodiments of the present disclosure are not necessarily limited thereto. The underfill resin 122 may be in direct contact with a lateral side surface of the second upper solder resist pattern 114B. The second upper solder resist pattern 114B may prevent the underfill resin 122 from extending from the chip mounting region R1 to the interconnection region R2.

Thereafter, the upper substrate 130 including the upper insulating layer 131, the upper wiring layer 132, the upper wiring via 133, the upper solder resist layers 134, and the pattern layer 135 may be prepared. The upper substrate 130 may be formed through a process the same as or similar to the process of forming of the lower substrate 110 described with reference to an embodiment of FIG. 10A. For example, the upper substrate 130 may form a landing region by exposing a portion of the lowermost upper wiring layer 132, and the upper connection structure 140B may be formed on the exposed landing region. The upper connection structure 140B may be formed by applying a solder paste including tin (Sn) or an alloy including tin (Sn). The upper connection structure 140B may have a spherical shape or ball shape.

Thereafter, central axes of the upper and lower connection structures 140B and 140A may be aligned to be disposed linearly in the Z-axis direction perpendicular to the upper surface of the lower substrate 110 and the upper substrate 130 may be attached to the lower substrate 110. For example, while the upper and lower connection structures 140B and 140A are aligned to overlap in the Z-axis direction, the upper substrate 130 may be moved in the direction of the lower substrate 110 such that the upper substrate 130 disposed on the lower substrate 110 may be formed.

Referring to FIG. 10C, a vertical connection structure 140 may be formed. In an embodiment, the vertical connection structure 140 may be formed by connecting the upper and lower connection structures 140B and 140A in FIG. 10B to each other through a thermal compression (TC) bonding process. The vertical connection structure 140 may include an outwardly curved side surface between the upper substrate 130 and the lower substrate 110. In an embodiment, a washing process of removing unnecessary residues after the thermocompression bonding process may be additionally performed. However, the process of forming the vertical connection structure 140 by connecting the upper and lower connection structures 140B and 140A to each other is not limited thereto. The process of connecting the upper connection structure 140B disposed below the upper substrate 130 working as an interposer to the lower connection structure 140A on the lower substrate 110 through the thermocompression bonding process may be referred to as an interposer block bonding (IBB) process. In the IBB process, when the distance between the upper and lower substrates 110 and 130 is relatively narrow, the upper connection structure 140B may excessively press the lower connection structure 140A, such that the maximum width of the curved surface of the vertical connection structure 140 may be increased. Accordingly, a short-circuit phenomenon may occur between the connection structures 140 adjacently to each other. Also, in the IBB process, when the distance between the upper and lower substrates 110 and 130 is not uniform, the thickness between the vertical connection structures 140 may not be uniform, such that electrical performance may be deteriorated. The third upper solder resist pattern 114C may work as a spacer which may adjust the thickness of the vertical connection structure 140 by adjusting the distance between the upper and lower substrates 110 and 130 in the IBB process, and may be uniformly disposed on the region adjacently to the vertical connection structures 140 to form the thicknesses of the connection structures 140 to be uniform.

Thereafter, referring to FIGS. 1A and 1B, the space between the upper and lower substrates 130 and 110 may be formed with an insulating material, thereby forming the encapsulant 150, and by forming the connection bump 160 and the passive device 170 in direct contact with the lower wiring layer 112 of the lower substrate 110, the semiconductor package 100 in FIGS. 1A and 1B may be formed.

According to the aforementioned embodiments, by uniformly disposing a solder resist pattern in a position adjacent to the connection structure, a semiconductor package in which a contact defect issue is prevented may be provided.

Also, by including a solder resist pattern supporting the space between the upper and lower substrates, over-pressing and shifting which may occur during the process of forming the connection structure may be prevented.

While embodiments of the present disclosure have been illustrated and described above, it will be apparent to those skilled in the art that modifications and variations could be made without departing from the scope of the present disclosure.

What is claimed is:

1. A semiconductor package, comprising:
a lower substrate having first and second surfaces opposing each other, wherein the first surface has a chip mounting region, an interconnection region surrounding the chip mounting region, and an outer region surrounding the interconnection region, the lower substrate further includes a lower wiring layer having bonding regions;
a first solder resist pattern disposed on the first surface of the lower substrate and having first openings exposing the bonding regions of the lower wiring layer;
a semiconductor chip disposed on the chip mounting region and electrically connected to the lower wiring layer through at least a portion of the first openings;
a second solder resist pattern on the first solder resist pattern on the interconnection region and the outer region of the lower substrate and spaced apart from the semiconductor chip, the second solder resist pattern having second openings disposed on at least a portion of the first openings;
an upper substrate disposed to cover the semiconductor chip on the first surface of the lower substrate, the upper substrate including an upper wiring layer;
a vertical connection structure disposed on the interconnection region and electrically connecting the lower wiring layer to the upper wiring layer through at least a portion of the first openings and the second openings; and
a solder resist spacer disposed on the second solder resist pattern on the outer region.

2. The semiconductor package of claim 1, wherein an upper surface of the solder resist spacer directly contacts the upper substrate.

3. The semiconductor package of claim 1, wherein a lower surface of the solder resist spacer directly contacts an upper surface of the second solder resist pattern.

4. The semiconductor package of claim 1, wherein the solder resist spacer has a thickness that is greater than a thickness of each of the first and second solder resist patterns.

5. The semiconductor package of claim 4, wherein:
the thickness of the solder resist spacer is in a range of about 150 μm to about 250 μm; and
the thickness of the second solder resist pattern is in a range of about 5 μm to about 20 μm.

6. The semiconductor package of claim 1, wherein the solder resist spacer includes a single pattern continuously extending along side surfaces on the outer region.

7. The semiconductor package of claim 1, wherein the vertical connection structure covers lateral side surfaces of the first and second openings of the first and second solder resist patterns and directly contacts the lower wiring layer.

8. The semiconductor package of claim 1, further comprising:
an underfill resin covering a lower surface of the semiconductor chip,
wherein at least a portion of a lateral side surface of the second solder resist pattern directly contacts the underfill resin.

9. The semiconductor package of claim 8, wherein the underfill resin is spaced apart from the solder resist spacer.

10. The semiconductor package of claim 1, further comprising:
an encapsulant filling spaces between the lower substrate and the upper substrate and covering at least a portion of each of the semiconductor chip and the vertical connection structure,
wherein the solder resist spacer includes a lower solder resist spacer and an upper solder resist spacer disposed on the lower solder resist spacer, and
wherein a sum of thicknesses of the upper and lower solder resist spacers is substantially equal to a thickness of the encapsulant.

11. The semiconductor package of claim 10, wherein a minimum distance between the upper solder resist spacer and the vertical connection structure is different from a minimum distance between the lower solder resist spacer and the vertical connection structure.

12. The semiconductor package of claim 1, wherein the solder resist spacer includes a plurality of patterns disposed on the outer region.

13. The semiconductor package of claim 1, further comprising:
auxiliary solder resist spacers disposed on the second solder resist pattern on the interconnection region of the lower substrate,
wherein the auxiliary solder resist spacers directly contact the upper substrate.

14. The semiconductor package of claim 13, wherein the solder resist spacer and the auxiliary solder resist spacers have thicknesses that are substantially equal to each other.

15. A semiconductor package, comprising:
a lower substrate including a lower wiring layer and first to third solder resist patterns sequentially stacked on the lower wiring layer, the lower substrate having a chip mounting region, an interconnection region surrounding the chip mounting region and an outer region surrounding the interconnection region;
a semiconductor chip disposed on the chip mounting region and electrically connected to the lower wiring layer;
an upper substrate disposed on the semiconductor chip, the upper substrate including an upper wiring layer; and
a vertical connection structure disposed on the interconnection region and electrically connecting the lower wiring layer to the upper wiring layer,
wherein the third solder resist pattern is disposed on the outer region and directly contacts at least a portion of the upper substrate.

16. The semiconductor package of claim 15, further comprising:
an underfill resin covering a lower surface of the semiconductor chip,
wherein a lateral side surface of the second solder resist pattern directly contacts the underfill resin, and
wherein the third solder resist pattern is spaced apart from the underfill resin.

17. The semiconductor package of claim 15, further comprising:
an encapsulant filling a space between the lower substrate and the upper substrate and covering at least a portion of each of the semiconductor chip and the vertical connection structure,
wherein a thickness of the third solder resist pattern is substantially equal to a thickness of the encapsulant.

18. A semiconductor package, comprising:
a lower substrate including a lower wiring layer, and first to third solder resist patterns sequentially stacked on the lower wiring layer;
a semiconductor chip disposed on the lower substrate and electrically connected to the lower wiring layer;
an upper substrate disposed on the semiconductor chip, the upper substrate having a lower surface adjacent to the semiconductor chip, the upper substrate including an upper wiring layer;
a vertical connection structure disposed between the lower substrate and the upper substrate and electrically connecting the lower wiring layer to the upper wiring layer; and
an encapsulant filling spaces between the lower substrate and the upper substrate and covering at least a portion of each of the semiconductor chip and the vertical connection structure,
wherein the connection structure has a hole shape including an outwardly curved side surface,
wherein the connection structure has a maximum width on a first level, and
an upper surface of the third solder resist pattern is disposed on a second level that is higher than the first level.

19. The semiconductor package of claim 18, wherein an upper surface of the second solder resist pattern is disposed on a third level lower than the first level.

20. The semiconductor package of claim 18, wherein:
a lower surface of the third solder resist pattern directly contacts the second solder resist pattern;
an upper surface of the third solder resist pattern directly contacts the upper substrate; and
the third solder resist pattern is spaced apart from the connection structure.

* * * * *